(12) United States Patent
Ichihashi et al.

(10) Patent No.: US 12,161,045 B2
(45) Date of Patent: Dec. 3, 2024

(54) PYRROMETHENE BORON COMPLEX, LIGHT EMITTING ELEMENT USING SAME, DISPLAY DEVICE, LIGHTING DEVICE, COLOR CONVERSION COMPOSITION, COLOR CONVERSION FILM, COLOR CONVERSION SUBSTRATE, LIGHT SOURCE UNIT AND DISPLAY

(71) Applicant: Toray Industries, Inc., Tokyo (JP)

(72) Inventors: Yasunori Ichihashi, Otsu (JP); Daisaku Tanaka, Otsu (JP); Tsubasa Okano, Kamakura (JP)

(73) Assignee: Toray Industries, Inc., Tokyo (JP)

( * ) Notice: Subject to any disclaimer, the term of this patent is extended or adjusted under 35 U.S.C. 154(b) by 840 days.

(21) Appl. No.: 17/267,936

(22) PCT Filed: Aug. 22, 2019

(86) PCT No.: PCT/JP2019/032895
§ 371 (c)(1),
(2) Date: Feb. 11, 2021

(87) PCT Pub. No.: WO2020/045242
PCT Pub. Date: Mar. 5, 2020

(65) Prior Publication Data
US 2021/0336145 A1    Oct. 28, 2021

(30) Foreign Application Priority Data

Aug. 27, 2018   (JP) .................................. 2018-158224

(51) Int. Cl.
*H10K 85/30* (2023.01)
*C07F 5/02* (2006.01)
(Continued)

(52) U.S. Cl.
CPC ........... *H10K 85/322* (2023.02); *C07F 5/022* (2013.01); *C09K 11/02* (2013.01); *C09K 11/06* (2013.01);
(Continued)

(58) Field of Classification Search
CPC ....................................................... C07F 5/022
See application file for complete search history.

(56) References Cited

U.S. PATENT DOCUMENTS

| | | | |
|---|---|---|---|
| 2019/0345380 A1 | 11/2019 | Ichihashi et al. | |
| 2022/0407007 A1* | 12/2022 | Kawamoto | ............ C09K 11/06 |

FOREIGN PATENT DOCUMENTS

| | | |
|---|---|---|
| JP | 2002134275 A | 5/2002 |
| JP | 2002169275 A | 6/2002 |

(Continued)

OTHER PUBLICATIONS

Kowada et al., Organic Letters, 2010, 12(2), pp. 296-299. (Year: 2010).*

(Continued)

*Primary Examiner* — Laura L Stockton
(74) *Attorney, Agent, or Firm* — Buchanan Ingersoll & Rooney PC

(57) ABSTRACT

A pyrromethene-boron complex that can be used as a red light fluorescent material with improved emission efficiency and color purity is provided. A pyrromethene-boron complex represented by the following general formula (1) and satisfying at least one of (A) and (B) is provided:

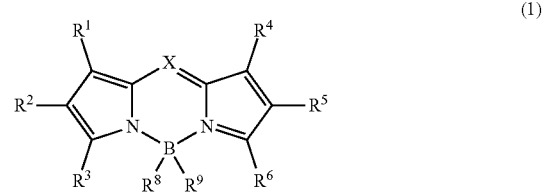

wherein, in the formula, X and $R^1$ to $R^9$ are selected from predetermined groups, at least one of four pairs of $R^1$ and $R^2$, $R^2$ and $R^3$, $R^4$ and $R^5$, and $R^5$ and $R^6$ has a ring structure represented by any one of the following general formulas (2A) to (2D):

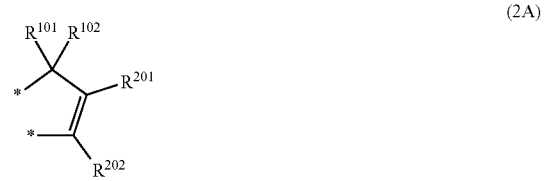

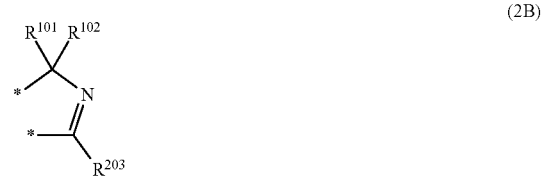

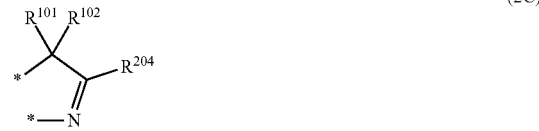

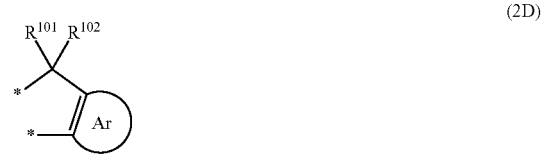

wherein, in the formulas, $R^{101}$, $R^{102}$ and $R^{201}$ to $R^{204}$ have the same meaning as $R^1$ to $R^7$ in the general formula (Continued)

(1), Ar is a substituted or unsubstituted aromatic hydrocarbon ring, or a substituted or unsubstituted aromatic heterocycle, $R^{101}$ and $R^{102}$ may form a ring, and * indicates a connection with the pyrromethene skeleton.

18 Claims, 2 Drawing Sheets

(51) Int. Cl.
| | |
|---|---|
| *C09K 11/02* | (2006.01) |
| *C09K 11/06* | (2006.01) |
| *H10K 50/11* | (2023.01) |
| *H10K 102/00* | (2023.01) |

(52) U.S. Cl.
CPC ............. *C09K 2211/1007* (2013.01); *C09K 2211/1011* (2013.01); *C09K 2211/1018* (2013.01); *H10K 50/11* (2023.02); *H10K 2102/3026* (2023.02)

(56) References Cited

FOREIGN PATENT DOCUMENTS

| | | |
|---|---|---|
| JP | 2003012676 A | 1/2003 |
| JP | 2016006033 A | 1/2016 |
| WO | 2018101129 A1 | 6/2018 |

OTHER PUBLICATIONS

Chemical Abstracts Registry No. 2120329-57-7, indexed in the Registry file on STN CAS Online Aug. 25, 2017. (Year: 2017).*
Burghart et al., "3,5-Diaryl-4,4-difluoro-4-bora-3a,4a-diaza-s-indacene (BODIPY) Dyes: Synthesis, Spectroscopic, Electrochemical, and Structural Properties", J. Org. Chem., 1999, vol. 64, No. 21, pp. 7813-7819.
Hinton et al., "Mapping Forbidden Emission to Structure in Self-Assembled Organic Nanoparticles", J. Am. Chem. Soc., 2018, 140, pp. 15827-15841.
Jiang et al., "Synthesis and photophysical properties of long wavelength absorbing BODIPY/aza-BODIPY bearing a five-membered ring", Tetrahedron Letters 59, 2018, pp. 546-549.
Kollmannsberger et al., "Electrogenerated Chemiluminescence and Proton-Dependent Switching of Fluorescence: Functionalized Difluoroboradiaza-s-indacenes", Angew. Chem. Int. Ed. Engl., 1997, vol. 36, No. 12, pp. 1333-1335.
Kowada et al., "Highly Fluorescent BODIPY Dyes Modulated with Spirofluorene Moieties", Org. Lett., 2010, vol. 12, No. 2, pp. 296-299.
Lupo et al., "Probing Heterogeneity and Bonding at Silica Surfaces through Single-Molecule Investigation of Base-Mediated Linkage Failure", Langmuir, 2016, 32, pp. 9171-9179.
Muller et al., "Nanoparticle-Based Fluoroionophore for Analysis of Potassium Ion Dynamics in 3D Tissue Models and In Vivo", Adv. Funct. Mater., 2018, 28, 1704598, 12 pages.
International Search Report and Written Opinion for International Application No. PCT/JP2019/032895, dated Nov. 19, 2019, 9 pages.
Nakagawa et al., "Dipyrromethene boron complex photoacid generator for visible ray-sensitive photosensitive material composition, and dipyrromethene boron complex", Jan. 1, 2002, 2 pages, XP055905592.
Majumdar et al., "Synthesis, characterization and photophysical properties of an acenaphtalene fused-ring-expanded NIR absorbing aza-BODIPY dye", RSC Advances, Jan. 1, 2015, vol. 5(95), pp. 78253-78258, XP055903220.
Kowada et al., "Near-infrared BODIPY dyes modulated with spirofluorene moieties", Tetrahedron, Apr. 1, 2011, vol. 67(17), pp. 3105-3110, XP055751321.
Müller et al., "Red-to NIR-emitting, BODIPY-based, K+-selective fluoroionophores and sensing materials", Advanced Functional Materials, Sep. 14, 2016, vol. 26(42), pp. 7697-7707, XP055790016.
Müller et al., "Sodium-selective fluoroionophores-based optodes for seawater salinity measurement", Analytical Chemistry, Jul. 5, 2017, vol. 89(1), pp. 7195-7202, XP055903253, Retrieved from the Internet: https://pubs.acs.org/doi/pdf/10.1021/acs.analchem.7b01373>.
Schellhammer et al., "Tuning near-infrared absorbing donor materials: A study of electronic, optical, and charge-transport properties of aza-BODIPYs", Chemistry of Materials, Jun. 26, 2017, vol. 29(13), pp. 5525-5536, XP055629662.
Ng et al., "Single-molecule investigation of initiation dynamics of an organometallic catalyst", Journal of the American Chemical Society, Mar. 23, 2016, vol. 138(11), pp. 3876-3883, XP055903197, Retrieved from the Internet: https://pubs.acs.org/doi/pdf/20.1021/jacs.6b00357>.
Extended European Search Report for European Application No. 19 854 710.1, dated April 5, 2022, 13 pages.

* cited by examiner

PYRROMETHENE BORON COMPLEX, LIGHT EMITTING ELEMENT USING SAME, DISPLAY DEVICE, LIGHTING DEVICE, COLOR CONVERSION COMPOSITION, COLOR CONVERSION FILM, COLOR CONVERSION SUBSTRATE, LIGHT SOURCE UNIT AND DISPLAY

CROSS REFERENCE TO RELATED APPLICATIONS

This is the U.S. National Phase Application of PCT/JP2019/032895, filed Aug. 22, 2019, which claims priority to Japanese Patent Application No. 2018-158224, filed Aug. 27, 2018.

FIELD OF THE INVENTION

The present invention relates to a pyrromethene-boron complex, as well as a light emitting element, a display device, a lighting device, a color conversion composition, a color conversion film, a color conversion substrate, a light source unit, and a display using the pyrromethene-boron complex.

BACKGROUND OF THE INVENTION

An organic thin film light emitting element is thin and can emit light of high brightness at a low driving voltage. In addition, multicolor emission is possible by selecting an appropriate fluorescent material such as a fluorescent material or a phosphorescent material.

One problem of a liquid crystal display using an organic thin film light emitting element is to improve the color reproducibility. In order to improve the color reproducibility, it is effective to narrow the full width at half maximum of each emission spectrum of blue, green, and red of the light source unit and thus increase the color purity of the blue, green, and red colors. In order to solve this, a technology of using quantum dots made of inorganic semiconductor fine particles as a component of a color conversion composition has been proposed. This technology of using quantum dots certainly resulted in a narrower full width at half maximum of green and red emission spectra and improved the color reproducibility, but on the other hand, quantum dots were vulnerable to heat and moisture and oxygen in the air, and had insufficient durability.

Further, a technology of using an organic fluorescent material instead of quantum dots as a component of a color conversion composition has also been proposed. For example, as a technology of using an organic fluorescent material as a component of a color conversion composition, the use of a pyrromethene derivative has been disclosed.

Among multicolor emissions, red emission has been studied progressively as a useful emission color. Conventionally, perylene materials such as bis(diisopropylphenyl)perylene, perinone materials, porphyrin materials, Eu complexes and the like have been known as red fluorescent materials.

As a fluorescent material, particularly as a dopant material, a pyrromethene compound, which is a compound emitting light with a high brightness, has been known (see, for example, Patent Document 1). Further, a compound in which a fused ring structure is introduced into a pyrromethene skeleton has also been known (see, for example, Patent Document 2).

PRIOR ART DOCUMENTS

Patent Documents

Patent Document 1: JP2003-12676A
Patent Document 2: JP2002-134275A

SUMMARY OF THE INVENTION

Many of the fluorescent materials used in the prior art showed low efficiency emission and high power consumption, and due to the poor durability of the compound, resulted in a short life of the element. Especially in the case of red color, a fluorescent material which satisfies both of high efficiency emission and high color purity has not been obtained. The present invention solves the problems of the prior art, and aims at providing a pyrromethene-boron complex which can be used as a red fluorescent material having high efficiency emission and excellent color purity, a light emitting element, a display device, a lighting device, a color conversion composition, a color conversion film, a color conversion substrate, a light source unit, and a display.

The present invention is a pyrromethene-boron complex represented by the following general formula (1) and satisfying at least one of the following (A) and (B).

[Chem 1]

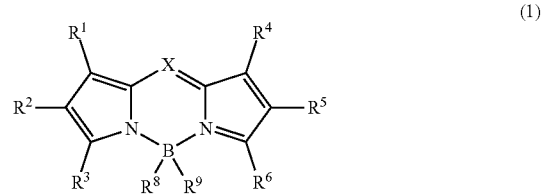

(1)

In the general formula (1), X is C—$R^7$ or N. $R^1$ to $R^7$ each may be the same or different, and are selected from hydrogen atom, alkyl group, cycloalkyl group, heterocyclic group, alkenyl group, cycloalkenyl group, alkynyl group, hydroxyl group, thiol group, alkoxy group, alkylthio group, aryl ether group, aryl thioether group, aryl group, heteroaryl group, halogen, cyano group, aldehyde group, carboxyl group, ester group, amide group, acyl group, sulfonyl group, sulfonic acid ester group, sulfonamide group, nitro group, silyl group, siloxanyl group, boryl group, phosphine oxide group, and the selected group may form a ring structure with an adjacent group.

$R^8$ and $R^9$ each may be the same or different, and are selected from alkyl group, cycloalkyl group, heterocyclic group, alkenyl group, cycloalkenyl group, alkynyl group, hydroxyl group, thiol group, alkoxy group, alkylthio group, aryl ether group, aryl thioether group, aryl group, heteroaryl group, halogen, or cyano group.

At least one of four pairs of $R^1$ and $R^2$, $R^2$ and $R^3$, $R^4$ and $R^5$, and $R^5$ and $R^6$ has a ring structure represented by any one of the following general formulas (2A) to (2D).

[Chem 2]

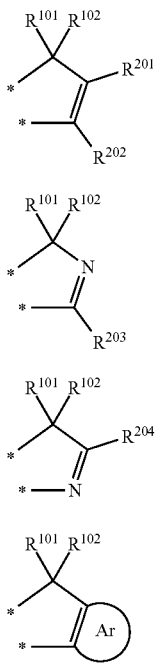

(2A)
(2B)
(2C)
(2D)

In the general formulas (2A) to (2D), $R^{101}$, $R^{102}$ and $R^{201}$ to $R^{204}$ have the same meaning as $R^1$ to $R^7$ in the general formula (1). Ar is a substituted or unsubstituted aromatic hydrocarbon ring, or a substituted or unsubstituted aromatic heterocycle. $R^{101}$ and $R^{102}$ may form a ring, and * indicates a connection with the pyrromethene skeleton.

(A) One of two pairs of $R^1$ and $R^2$, and $R^2$ and $R^3$ has a ring structure represented by any one of the above general formulas (2A) to (2D), and $R^4$, $R^5$ and $R^6$ do not form a ring structure with adjacent groups. When $R^2$ and $R^3$ have a ring structure of the above general formula (2D) and $R^7$ is an aryl group, the aryl group is selected from substituted phenyl group, aryl group having a structure in which two or more rings are fused, and heteroaryl group having a structure in which two or more rings are fused.

(B) One of two pairs of $R^1$ and $R^2$, and $R^2$ and $R^3$ has a ring structure represented by any one of the above general formulas (2A) to (2D), and one of two pairs of $R^4$ and $R^5$, and $R^5$ and $R^6$ has a ring structure represented by any one of the above general formulas (2A) to (2D). When both of $R^2$ and $R^3$, and $R^5$ and $R^6$ have a ring structure of the above general formula (2D) and $R^7$ is an aryl group, the aryl group is selected from the following (i) to (iii);

(i) phenyl group having in the para position a group or atom selected from substituted or unsubstituted alkyl group having 2 or more carbon atoms, substituted or unsubstituted cycloalkyl group, substituted or unsubstituted alkoxy group having 2 or more carbon atoms, substituted or unsubstituted alkylthio group, substituted or unsubstituted aryl ether group, substituted or unsubstituted aryl thioether group, substituted or unsubstituted aryl group, substituted or unsubstituted heteroaryl group, cyano group, nitro group, substituted or unsubstituted silyl group, substituted or unsubstituted phosphine oxide group, fluorine atom, and chlorine atom;

(ii) phenyl group having at least one substituent group in the ortho or meta position;

(iii) aryl group having a structure in which two or more rings are fused.

According to the present invention, it is possible to obtain red emission with high efficiency emission and high color purity.

DETAILED DESCRIPTION OF EMBODIMENTS OF THE INVENTION

Figure 1:
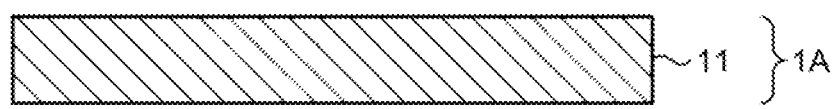
FIG. 1 is a schematic cross-sectional view of a first example of a color conversion film according to an embodiment of the present invention.

Suitable embodiments of the pyrromethene-boron complex according to the present invention, as well as a light emitting element, a display device, a lighting device, a color conversion composition, a color conversion film, a color conversion substrate, a light source unit, and a display using the pyrromethene-boron complex are described below in detail. However, the present invention is not limited to the following embodiments and can be variously modified and implemented according to the purpose and application.

The pyrromethene-boron complex of the present invention is a compound which is represented by the general formula (1) and which satisfies at least one of the following (A) and (B). The details are as follows.

[Chem 3]

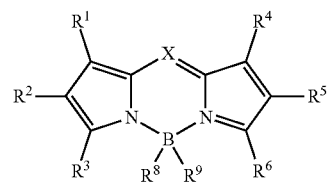

(1)

In the general formula (1), X is C—$R^7$ or N. $R^1$ to $R^7$ each may be the same or different, and are selected from hydrogen atom, alkyl group, cycloalkyl group, heterocyclic group, alkenyl group, cycloalkenyl group, alkynyl group, hydroxyl group, thiol group, alkoxy group, alkylthio group, aryl ether group, aryl thioether group, aryl group, heteroaryl group, halogen, cyano group, aldehyde group, carboxyl group, ester group, amide group, acyl group, sulfonyl group, sulfonic acid ester group, sulfonamide group, nitro group, silyl group, siloxanyl group, boryl group, phosphine oxide group, and the selected group may form a ring structure with an adjacent group.

$R^8$ and $R^9$ each may be the same or different, and are selected from alkyl group, cycloalkyl group, heterocyclic group, alkenyl group, cycloalkenyl group, alkynyl group, hydroxyl group, thiol group, alkoxy group, alkylthio group, aryl ether group, aryl thioether group, aryl group, heteroaryl group, halogen, or cyano group.

At least one of four pairs of $R^1$ and $R^2$, $R^2$ and $R^3$, $R^4$ and $R^5$, and $R^5$ and $R^6$ has a ring structure represented by any one of the following general formulas (2A) to (2D).

[Chem 4]

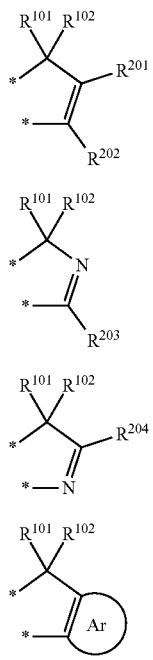

In the general formulas (2A) to (2D), $R^{101}$, $R^{102}$ and $R^{201}$ to $R^{204}$ have the same meaning as $R^1$ to $R^7$ in the general formula (1). Ar is a substituted or unsubstituted aromatic hydrocarbon ring, or a substituted or unsubstituted aromatic heterocycle. $R^{101}$ and $R^{102}$ may form a ring, and * indicates a connection with the pyrromethene skeleton.

The pyrromethene-boron complex according to embodiments of the present invention also satisfies at least one of the following (A) and (B).

(A) One of two pairs of $R^1$ and $R^2$, and $R^2$ and $R^3$ has a ring structure represented by any one of the above general formulas (2A) to (2D), and $R^4$, $R^5$ and $R^6$ do not form a ring structure with adjacent groups. When $R^2$ and $R^3$ have a ring structure of the above general formula (2D) and $R^7$ is an aryl group, the aryl group is selected from substituted phenyl group, aryl group having a structure in which two or more rings are fused, and heteroaryl group having a structure in which two or more rings are fused.

(B) One of two pairs of $R^1$ and $R^2$, and $R^2$ and $R^3$ has a ring structure represented by any one of the above general formulas (2A) to (2D), and one of two pairs of $R^4$ and $R^5$, and $R^5$ and $R^6$ has a ring structure represented by any one of the above general formulas (2A) to (2D). When both of $R^2$ and $R^3$, and $R^5$ and $R^6$ have the ring structure of the above general formula (2D) and $R^7$ is an aryl group, the aryl group is selected from the following (i) to (iii);

(i) phenyl group having in the para position a group or atom selected from substituted or unsubstituted alkyl group having 2 or more carbon atoms, substituted or unsubstituted cycloalkyl group, substituted or unsubstituted alkoxy group having 2 or more carbon atoms, substituted or unsubstituted alkylthio group, substituted or unsubstituted aryl ether group, substituted or unsubstituted aryl thioether group, substituted or unsubstituted aryl group, substituted or unsubstituted heteroaryl group, cyano group, nitro group, substituted or unsubstituted silyl group, substituted or unsubstituted phosphine oxide group, fluorine atom, and chlorine atom;

(ii) phenyl group having at least one substituent group in the ortho or meta position;

(iii) aryl group having a structure in which two or more rings are fused.

As can be seen from the above description, in the present invention, a part of the pyrromethene skeleton has a fused ring structure, and the expanded ring structure is also included in the "pyrromethene".

In all the groups described above, hydrogen may be deuterium. This also applies to the compounds or their partial structures described below.

In the following description, for example, a substituted or unsubstituted aryl group having 6 to 40 carbon atoms means that 6 to 40 carbon atoms also include the number of carbon atoms contained in the substituent group substituted on the aryl group, and the same applies to other substituent groups with a defined number of carbon atoms.

In all the groups described above, preferred examples of the substituent groups in the case of substitution include alkyl groups, cycloalkyl groups, heterocyclic groups, alkenyl groups, cycloalkenyl groups, alkynyl groups, hydroxyl groups, thiol groups, alkoxy groups, alkylthio groups, aryl ether groups, aryl thioether groups, aryl groups, heteroaryl groups, halogens, cyano groups, aldehyde groups, carbonyl groups, carboxyl groups, oxycarbonyl groups, carbamoyl groups, amino groups, nitro groups, silyl groups, siloxanyl groups, boryl groups, and phosphine oxide groups. Furthermore, a specific substituent group which is explained to be preferred in the description of each substituent group is preferred. Further, these substituent groups may be further substituted with the above-mentioned substituent groups.

The term "unsubstituted" in "substituted or unsubstituted" means the substitution with a hydrogen atom or a deuterium atom.

The same definition applies to "substituted or unsubstituted" in the compounds or their partial structures described below.

In the above general formulas (1) and (2A) to (2D), the alkyl group refers to, for example, a saturated aliphatic hydrocarbon group such as a methyl group, an ethyl group, an n-propyl group, an isopropyl group, an n-butyl group, a sec-butyl group, or a tert-butyl group, which may or may not have a substituent group. The number of carbon atoms of the alkyl group is not particularly limited, but is preferably 1 or more and 20 or less, more preferably 1 or more and 8 or less, from the viewpoint of easy availability and cost.

The cycloalkyl group refers to, for example, a saturated alicyclic hydrocarbon group such as a cyclopropyl group, a cyclohexyl group, a norbornyl group, and an adamantyl group, which may or may not have a substituent group. The number of carbon atoms of the cycloalkyl group moiety is not particularly limited, but is preferably in the range of 3 or more and 20 or less.

The heterocyclic group refers to an aliphatic ring having an atom other than carbon in the ring, such as a pyran ring, a piperidine ring, and a cyclic amide, which may or may not have a substituent group. The number of carbon atoms of the heterocyclic group is not particularly limited, but is preferably in the range of 2 or more and 20 or less.

The alkenyl group refers to an unsaturated aliphatic hydrocarbon group containing a double bond, such as a vinyl group, an allyl group, or a butadienyl group, which may or may not have a substituent group. The number of carbon atoms of the alkenyl group is not particularly limited, but is preferably in the range of 2 or more and 20 or less.

The cycloalkenyl group refers to an unsaturated alicyclic hydrocarbon group containing a double bond, such as a cyclopentenyl group, a cyclopentadienyl group, a cyclohexenyl group, which may or may not have a substituent group.

The alkynyl group refers to an unsaturated aliphatic hydrocarbon group containing a triple bond such as an ethynyl group, which may or may not have a substituent group. The number of carbon atoms of the alkynyl group is not particularly limited, but is preferably in the range of 2 or more and 20 or less.

The alkoxy group refers to a functional group in which an aliphatic hydrocarbon group is bound via an ether bond, such as a methoxy group, an ethoxy group, or a propoxy group, and the aliphatic hydrocarbon group may or may not have a substituent group. The number of carbon atoms of the alkoxy group is not particularly limited, but is preferably in the range of 1 or more and 20 or less.

The alkylthio group is an alkoxy group in which the oxygen atom of the ether bond of the alkoxy group is substituted with a sulfur atom. The hydrocarbon group of the alkylthio group may or may not have a substituent group. The number of carbon atoms of the alkylthio group is not particularly limited, but is preferably in the range of 1 or more and 20 or less.

The aryl ether group refers to a functional group in which an aromatic hydrocarbon group is bound via an ether bond, such as a phenoxy group, and the aromatic hydrocarbon group may or may not have a substituent group. The number of carbon atoms of the aryl ether group is not particularly limited, but is preferably in the range of 6 or more and 40 or less.

The aryl thioether group is an aryl ether group in which the oxygen atom of the ether bond is substituted with a sulfur atom. The aromatic hydrocarbon group of the aryl thioether group may or may not have a substituent group. The number of carbon atoms of the aryl thioether group is not particularly limited, but is preferably in the range of 6 or more and 40 or less.

The aryl group refers to an aromatic hydrocarbon group, and example thereof include phenyl groups, biphenyl groups, terphenyl groups, naphthyl groups, fluorenyl groups, benzofluorenyl groups, dibenzofluorenyl groups, phenanthryl groups, anthracenyl groups, benzophenanthryl groups, benzanthracenyl groups, chrysenyl groups, pyrenyl groups, fluoranthenyl groups, triphenylenyl groups, benzofluoranthenyl groups, dibenzanthracenyl groups, perylenyl groups, helicenyl groups and the like.

Among these, phenyl groups, biphenyl groups, terphenyl groups, naphthyl groups, fluorenyl groups, phenanthryl groups, anthracenyl groups, pyrenyl groups, fluoranthenyl groups and triphenylenyl groups are preferred. The aryl group may or may not have a substituent group. The number of carbon atoms of the aryl group is not particularly limited, but is preferably in the range of 6 or more and 40 or less, and more preferably 6 or more and 30 or less.

When $R^1$ to $R^9$ are substituted or unsubstituted aryl groups, the aryl group is preferably a phenyl group, a biphenyl group, a terphenyl group, a naphthyl group, a fluorenyl group, a phenanthryl group, or an anthracenyl group, and more preferably a phenyl group, a biphenyl group, a terphenyl group, or a naphthyl group. A phenyl group, a biphenyl group, or a terphenyl group is still more preferred, and a phenyl group is particularly preferred.

When each substituent group is further substituted with an aryl group, the aryl group is preferably a phenyl group, a biphenyl group, a terphenyl group, a naphthyl group, a fluorenyl group, a phenanthryl group, or an anthracenyl group, and more preferably a phenyl group, a biphenyl group, a terphenyl group, or a naphthyl group. A phenyl group is particularly preferred.

Further, in the substituted phenyl group, when there are substituent groups on two adjacent carbon atoms in the phenyl group, the substituent groups may form a ring structure with each other. The resulting group may correspond to, according to its structure, any one or more of "substituted phenyl group", "aryl group having a structure in which two or more rings are fused", and "heteroaryl group having a structure in which two or more rings are fused".

The heteroaryl group refers to a cyclic aromatic group having one or more atoms other than carbon in the ring, and examples thereof include pyridyl groups, furanyl groups, thiophenyl groups, quinolinyl groups, isoquinolinyl groups, pyrazinyl groups, pyrimidyl groups, pyridadinyl groups, triazinyl groups, naphthyridinyl groups, cinnolinyl groups, phthalazinyl groups, quinoxalinyl groups, quinazolinyl groups, benzofuranyl groups, benzothiophenyl groups, indolyl groups, dibenzofuranyl groups, dibenzothiophenyl groups, carbazolyl groups, benzocarbazolyl groups, carbolinyl groups, indolocarbazolyl groups, benzoflocarbazolyl groups, benzothienocarbazolyl groups, dihydroindenocarbazolyl groups, benzoquinolinyl groups, acrydinyl groups, dibenzoacrydinyl groups, benzoimidazolyl groups, imidazopyridyl groups, benzoxazolyl groups, benzothiazolyl groups, phenanthrolinyl groups, and the like. The naphthyridinyl group refers to any of a 1,5-naphthyridinyl group, a 1,6-naphthyridinyl group, a 1,7-naphthyridinyl group, a 1,8-naphthyridinyl group, a 2,6-naphthyridinyl group and a 2,7-naphthyridinyl group. The heteroaryl group may or may not have a substituent group. The number of carbon atoms of the heteroaryl group is not particularly limited, but is preferably in the range of 2 or more and 40 or less, and more preferably 2 or more and 30 or less.

When $R^1$ to $R^9$ are substituted or unsubstituted heteroaryl groups, preferred examples of the heteroaryl groups include pyridyl groups, furanyl groups, thiophenyl groups, quinolinyl groups, pyrimidyl groups, triazinyl groups, benzofuranyl groups, benzothiophenyl groups, indolyl groups, dibenzofuranyl groups, dibenzothiophenyl groups, carbazolyl groups, benzoimidazolyl groups, imidazopyridyl groups, benzoxazolyl groups, benzothiazolyl groups and phenanthrolinyl groups. Pyridyl groups, furanyl groups, thiophenyl groups and quinolinyl groups are more preferred. Pyridyl groups and quinolinyl groups are still more preferred, and pyridyl groups are particularly preferred.

When each substituent group is further substituted with a heteroaryl group, preferred examples of the heteroaryl groups include pyridyl groups, furanyl groups, thiophenyl groups, quinolinyl groups, pyrimidyl groups, triazinyl groups, benzofuranyl groups, benzothiophenyl groups, indolyl groups, dibenzofuranyl groups, dibenzothiophenyl groups, carbazolyl groups, benzoimidazolyl groups, imidazopyridyl groups, benzoxazolyl groups, benzothiazolyl groups and phenanthrolinyl groups. Pyridyl groups, furanyl groups, thiophenyl groups and quinolinyl groups are more preferred. Pyridyl groups are particularly preferred.

Halogen refers to an atom selected from fluorine, chlorine, bromine and iodine.

The carbonyl group, carboxyl group, oxycarbonyl group and carbamoyl group may or may not have a substituent group.

The ester group refers to a functional group in which, for example, an alkyl group, a cycloalkyl group, an aryl group, a heteroaryl group or the like is bound via an ester bond, and this substituent group may be further substituted. The number of carbon atoms of the ester group is not particularly limited, but is preferably in the range of 1 or more and 20 or less. Specific examples thereof include methyl ester groups such as methoxycarbonyl groups, ethyl ester groups such as ethoxycarbonyl groups, propyl ester groups such as propoxycarbonyl groups, butyl ester groups such as butoxycarbonyl groups, and isopropyl ester groups such as isopropoxymethoxycarbonyl groups, hexyl ester groups such as hexyloxycarbonyl groups, phenyl ester groups such as phenoxycarbonyl groups, and the like.

The amide group refers to a functional group in which, for example, an alkyl group, a cycloalkyl group, an aryl group, a heteroaryl group or the like is bound via an amide bond, and this substituent group may be further substituted. The number of carbon atoms of the amide group is not particularly limited, but is preferably in the range of 1 or more and 20 or less. Specific examples include methylamide groups, ethylamide groups, propylamide groups, butylamide groups, isopropylamide groups, hexylamide groups, phenylamide group, and the like.

The amino group is a substituted or unsubstituted amino group. Examples of the substituent group in the case of substitution include aryl groups, heteroaryl groups, linear alkyl groups and branched alkyl groups. As the aryl group or the heteroaryl group, a phenyl group, a naphthyl group, a pyridyl group or a quinolinyl group is preferred. These substituent groups may be further substituted. The number of carbon atoms is not particularly limited, but is preferably in the range of 2 or more and 50 or less, more preferably 6 or more and 40 or less, and particularly preferably 6 or more and 30 or less.

Examples of the silyl group include alkylsilyl groups such as trimethylsilyl groups, triethylsilyl groups, tert-butyldimethylsilyl groups, propyldimethylsilyl groups, vinyldimethylsilyl groups, and arylsilyl groups such as phenyldimethylsilyl groups, tert-butyldiphenylsilyl groups, triphenylsilyl groups and trinaphthylsilyl groups. The substituent groups on silicon may be further substituted. The number of carbon atoms of the silyl group is not particularly limited, but is preferably in the range of 1 or more and 30 or less.

The siloxanyl group refers to a silicon compound group via an ether bond such as a trimethylsiloxanyl group. The substituent groups on silicon may be further substituted.

The boryl group is a substituted or unsubstituted boryl group. Examples of substituent groups in the case of substitution include aryl groups, heteroaryl groups, linear alkyl groups, branched alkyl groups, aryl ether groups, alkoxy groups and hydroxyl groups, and among them, aryl groups and aryl ether groups are preferred.

The phosphine oxide group is a group represented by $-P(=O)R^{10}R^{11}$. $R^{10}R^{11}$ has the same meaning as $R^1$ to $R^7$.

The acyl group refers to a functional group in which, for example, an alkyl group, a cycloalkyl group, an aryl group, a heteroaryl group or the like is bound via a carbonyl bond, and this substituent group may be further substituted. The number of carbon atoms of the acyl group is not particularly limited, but is preferably in the range of 1 or more and 20 or less. Specific examples thereof include acetyl groups, propionyl groups, benzoyl groups, acryryl groups, and the like.

The sulfonyl group refers to a functional group in which, for example, an alkyl group, a cycloalkyl group, an aryl group, a heteroaryl group or the like is bound via a $-S(=O)_2-$ bond, and this substituent group may be further substituted.

The compound represented by the general formula (1) has a pyrromethene-boron complex skeleton. Since the pyrromethene-boron complex skeleton is a strong skeleton with a high planarity, the pyrromethene-boron complex skeleton exhibits a high fluorescence quantum yield. Furthermore, since the full width at half maximum of the peak of the emission spectrum is small, efficient emission and high color purity can be achieved.

When the pyrromethene-boron complex according to the present invention is used in a light emitting element or the like, sharp emission of light with a small full width at half maximum can be obtained. In general, when a pyrromethene-boron complex is used to emit light in a wavelength region longer than that of green, a group having a double bond is directly bound to the pyrromethene-boron complex skeleton to extend the conjugation and lengthen the wavelength of emission. However, if a double bond is simply bound, the structure changes to several stable structures in the excited state (hereinafter, structural relaxation), which results in emission from various energy states, and thus inactivation. In this case, the emission spectrum becomes broad, the full width at half maximum widens, and the color purity decreases. That is, it is necessary to devise a molecular design when the wavelength is lengthened by use of the pyrromethene-boron complex.

The pyrromethene-boron complex according to an embodiment of the present invention is a compound represented by the general formula (1), and has a ring structure represented by any one of the above general formulas (2A) to (2D) in the pyrromethene-boron complex skeleton.

The general formulas (2A) to (2D) have a double bond, and the double bond is always fixed to the pyrromethene-boron complex skeleton with a carbon atom by a chemical bond. As a result, excessive structural relaxation in the excited state can be suppressed, and the emission spectrum of the compound represented by the general formula (1) becomes sharp. When this pyrromethene-boron complex is used as a fluorescent material, emission with good color purity can be obtained.

The pyrromethene-boron complex according to an embodiment of the present invention also satisfies at least one of the above (A) and (B).

(A)

When one of two pairs of $R^1$ and $R^2$, and $R^2$ and $R^3$ has a ring structure represented by any one of the general formulas (2A) to (2D), and $R^4$, $R^5$ and $R^6$ do not form a ring structure with adjacent groups, moderate structural relaxation is caused while the compound represented by the general formula (1) is excited to emit light, and thus, sharp emission can be obtained while the Stokes shift is maintained to some extent. The Stokes shift is the difference between the absorption maximum wavelength and the fluorescence maximum wavelength. With a small Stokes shift, a phenomenon called self-absorption occurs, in which the complex absorbs its own fluorescence. Then, the fluorescence on the short wavelength side, which should be present originally, disappears. In this case, the use of a fluorescent material at a practical concentration results in broadened emission.

When $R^2$ and $R^3$ have a ring structure of the general formula (2D) and $R^7$ is an aryl group, the aryl group is selected from a substituted phenyl group or an aryl group having a structure in which two or more rings are fused. When $R^7$ is an aryl group, the conjugation is extended via the aryl group and the pyrromethene-boron complex skeleton, but when $R^7$ is an unsubstituted phenyl group, the phenyl group rotates, and the structural relaxation is likely to occur, resulting in broadened emission spectrum. On the other hand, when $R^7$ is a substituted phenyl group or an aryl group having a structure in which two or more rings are fused, the larger molecular weight of $R^7$ suppresses the rotation, and structural relaxation is thus suppressed. Therefore, sharp emission is obtained.

(B)

When one of two pairs of $R^1$ and $R^2$, and $R^2$ and $R^3$ has a ring structure represented by any one of the general formulas (2A) to (2D), and one of two pairs of $R^4$ and $R^5$, and $R^5$ and $R^6$ has a ring structure represented by any one of the general formulas (2A) to (2D), the double bond and the pyrromethene-boron complex skeleton are firmly fixed. Therefore, the conformations of the compound represented by the general formula (1) in the excited state are limited, and extremely sharp emission can be obtained.

When the pair of $R^2$ and $R^3$ has the ring structure of the general formula (2D), the pair of $R^5$ and $R^6$ has the ring structure of the general formula (2D), and $R^7$ is an aryl group, the aryl group is selected from the above (i) to (iii). When $R^7$ is an aryl group, the conjugation is extended via the aryl group and the pyrromethene-boron complex skeleton, but when $R^7$ is an unsubstituted phenyl group, the phenyl group rotates, and the structural relaxation is likely to occur, resulting in broadened emission spectrum. On the other hand, in the case of a substituted phenyl group or an aryl group having a structure in which two or more rings are fused, the larger molecular weight of $R^7$ suppresses the rotation, and structural relaxation is thus suppressed. Therefore, sharp emission is obtained.

In (B), since the structural relaxation of the pyrromethene-boron complex skeleton is suppressed as compared with (A), the influence of the aryl group of $R^7$ is large. Among substituted phenyl groups, with a phenyl group having a substituent group in the ortho or the meta position, or an aryl group having a structure in which two or more rings are fused, the substitution site projects outward with respect to the bond axis between the pyrromethene-boron complex skeleton and $R^7$. Thus, the rotation of the phenyl group is easily suppressed, and sharp emission can be obtained. In the case of a phenyl group having a substituent group in the para position, the substituent group in the para position exists on the bond axis between the pyrromethene-boron complex skeleton and $R^7$. Thus, a substituent group that is likely to suppress the rotation of the phenyl group needs to be appropriately selected. Therefore, when $R^7$ is an aryl group, the aryl group selected from any of the above-mentioned (i) to (iii) can result in suppressed structural relaxation and sharp emission.

Preferred examples of (i) include a 4-ethylphenyl group, a 4-n-propylphenyl group, a 4-isopropylphenyl group, a 4-n-butylphenyl group, a 4-t-butylphenyl group, a 4-ethoxyphenyl group, a 2,4-diethoxyphenyl group, a 2,4,6-triethoxyphenyl group, a biphenyl-4-yl group, a and the like.

Preferred phenyl group in the case of (ii) is a phenyl group having in the ortho or meta position a group or atom selected from substituted or unsubstituted alkyl group, substituted or unsubstituted cycloalkyl group, substituted or unsubstituted alkoxy group, substituted or unsubstituted alkylthio group, substituted or unsubstituted aryl ether group, substituted or unsubstituted aryl thioether group, substituted or unsubstituted aryl group, substituted or unsubstituted heteroaryl group, cyano group, nitro group, substituted or unsubstituted silyl group, substituted or unsubstituted phosphine oxide group, and halogen. Further, in order to increase the bulk and improve the emission efficiency, a phenyl group having in the ortho or meta position a substituted or unsubstituted alkyl group or a substituted or unsubstituted alkoxy group is preferred, and a phenyl group having in the ortho or meta position a methyl group, an ethyl group, an isopropyl group, a tert-butyl group, or a methoxy group is more preferred. From the viewpoint of dispersibility, a phenyl group having a tert-butyl group or a methoxy group in the ortho or meta position is particularly preferred, and quenching due to aggregation of molecules is prevented.

Preferred specific examples in the case of (ii) include a 2-tolyl group, a 3-tolyl group, a 2-methoxyphenyl group, a 3-methoxyphenyl group, a 2,4-xylyl group, a 3,5-xylyl group, a 2,6-xylyl group, a 2,4-dimethoxyphenyl group, a 3,5-dimethoxyphenyl group, a 2,6-dimethoxyphenyl group, a 2,4,6-trimethylphenyl group (mesityl group), a 2,4,6-trimethoxyphenyl group, a biphenyl-3-yl group, a 1,3-diphenyl-5-phenyl group, and the like.

The preferred aryl group in the case of (iii) is a naphthyl group, a phenanthryl group, an anthracenyl group, or a pyrenyl group. Furthermore, a naphthyl group is preferably used from the viewpoint of easy synthesis and easy availability of raw materials.

Preferred specific examples in the case of (iii) include a 1-naphthyl group, a 2-naphthyl group, a 9-anthracenyl group, a 1-pyrenyl group and the like.

As described above, the pyrromethene-boron complex represented by the general formula (1) and satisfying at least one of (A) and (B) exhibits a high fluorescence quantum yield and the emission spectrum has a small full width at half maximum of the peak. Therefore, emission with a high efficiency and high color purity can be achieved.

In the pyrromethene-boron complex of the present invention, the full width at half maximum of the peak of the emission spectrum is preferably 45 nm or less, more preferably 40 nm or less in a solution. In the case of use in a light emitting element, the full width at half maximum is preferably 50 nm or less, and more preferably 45 nm or less.

Furthermore, in the pyrromethene-boron complex represented by the general formula (1), various characteristics and physical properties such as emission efficiency, color purity, thermal stability, photostability, and dispersibility can be adjusted by introducing an appropriate substituent group at an appropriate position.

For example, the pyrromethene-boron complex represented by the general formula (1) is preferably a compound represented by any of the following general formulas (3A) to (3D).

[Chem 5]

(3A)

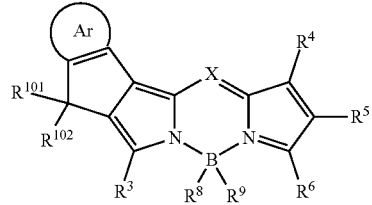

-continued

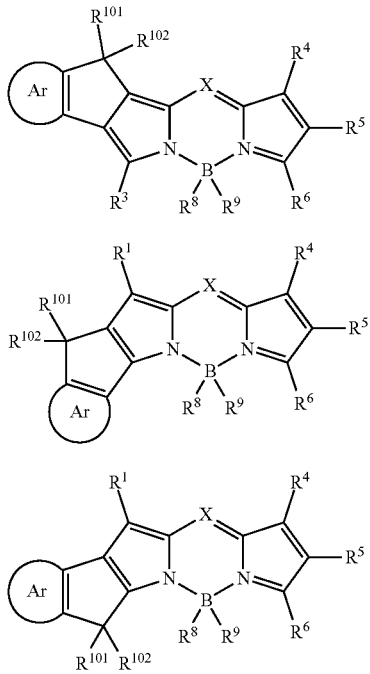

(3B)

(3C)

(3D)

In the general formula (3A) to (3D), X is C—R⁷ or N. $R^{101}$ and $R^{102}$ have the same meaning as $R^1$ to $R^7$ in the general formula (1). Ar is a substituted or unsubstituted aromatic hydrocarbon ring, or a substituted or unsubstituted aromatic heterocycle. $R^{101}$ and $R^{102}$ may form a ring.

When the double bond moiety in the ring structure formed by one of the two pairs of $R^1$ and $R^2$, and $R^2$ and $R^3$ is a substituted or unsubstituted aromatic hydrocarbon ring, or a substituted or unsubstituted aromatic heterocycle, the conjugation can be efficiently extended, and the emission with higher color purity at a longer wavelength is possible.

In addition, as an example, the pyrromethene-boron complex represented by the general formula (1) is preferably a compound represented by any of the following general formulas (4A) to (4D).

[Chem 6]

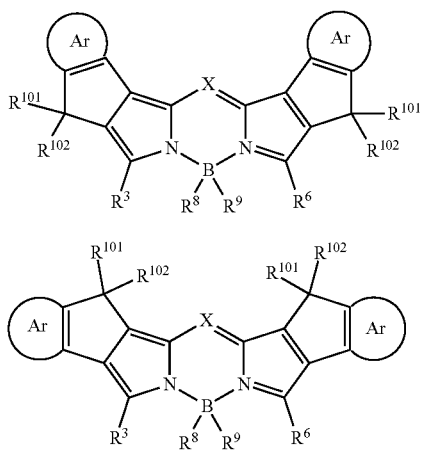

(4A)

(4B)

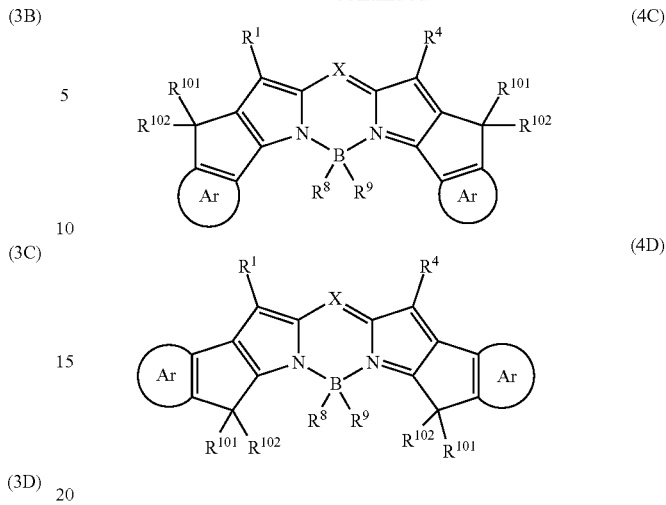

(4C)

(4D)

In the general formula (4A) to (4D), X is C—R⁷ or N. $R^{101}$ and $R^{102}$ have the same meaning as $R^1$ to $R^7$ in the general formula (1). Ar is a substituted or unsubstituted aromatic hydrocarbon ring, or a substituted or unsubstituted aromatic heterocycle. $R^{101}$ and $R^{102}$ may form a ring.

When the double bond moieties in the ring structures formed by one of the two pairs of $R^1$ and $R^2$, and $R^2$ and $R^3$ as well as by one of the two pairs of $R^4$ and $R^5$, and $R^5$ and $R^6$ are substituted or unsubstituted aromatic hydrocarbon rings, or substituted or unsubstituted aromatic heterocycles, and also when the both sides of the pyrromethene skeleton have fused rings, the conjugation can be further extended efficiently, and the emission with higher color purity at a longer wavelength is possible. Further, when a substituted or unsubstituted aromatic hydrocarbon ring or a substituted or unsubstituted aromatic heterocycle is contained, thermal and electrical stability is improved more than just a simple double bond.

In the general formulas (3A) to (3D) and (4A) to (4D), Ar is preferably a substituted or unsubstituted benzene ring, a substituted or unsubstituted naphthalene ring, a substituted or unsubstituted phenanthrene ring, a substituted or unsubstituted pyridine ring, a substituted or unsubstituted pyrimidine ring, or a substituted or unsubstituted pyrazine ring. Furthermore, Ar is more preferably a substituted or unsubstituted benzene ring because the thermal and electrical stability improves.

In the pyrromethene-boron complex according to the present invention, at least one of $R^1$ to $R^6$ is preferably a substituted or unsubstituted alkyl group, a substituted or unsubstituted aryl group, or a substituted or unsubstituted heteroaryl group. In this case, the compound represented by the general formula (1) exhibits better thermal stability and photostability. In particular, among $R^1$ to $R^6$, $R^1$, $R^3$, $R^4$ and $R^6$ are preferably the groups as described above. $R^1$, $R^3$, $R^4$ and $R^6$ have a large contribution from π electrons in the pyrromethene-boron complex skeleton and thus a large electronic effect. Therefore, these positions are the substitution positions where conjugation is most likely to expand. Thus, the thermal and electrical stability of the compound represented by the general formula (1) is further improved.

In the pyrromethene-boron complex according to the present invention, at least one of $R^1$ to $R^6$ is preferably a substituted or unsubstituted aryl group, or a substituted or unsubstituted heteroaryl group. In this case, the compound represented by the general formula (1) can emit light of a longer wavelength. At least one of $R^1$ to $R^6$ is more preferably a substituted or unsubstituted aryl group. In this case, the thermal and electrical stability of the compound represented by the general formula (1) is further improved.

In the compound represented by the general formula (1), when at least one of $R^1$, $R^3$, $R^4$ and $R^6$ is a substituted or unsubstituted alkyl group, emission with excellent color purity can be obtained. As the alkyl group, an alkyl group having 1 to 6 carbon atoms such as a methyl group, an ethyl group, an n-propyl group, an isopropyl group, an n-butyl group, a sec-butyl group, a tert-butyl group, a pentyl group or a hexyl group is preferred. Furthermore, a methyl group, an ethyl group, an n-propyl group, an isopropyl group, an n-butyl group, a sec-butyl group or a tert-butyl group is more preferred because of excellent thermal stability. From the viewpoint of preventing the concentration quenching and improving the emission quantum yield, a three-dimensionally bulky tert-butyl group is more preferred. From the viewpoint of easy synthesis and easy availability of raw materials, a methyl group is also preferably used.

In the pyrromethene-boron complex according to the present invention, it is preferred that X is C—R' and $R^7$ is a substituted or unsubstituted aryl group or a substituted or unsubstituted heteroaryl group because the electrical stability is improved. Specifically, a substituted phenyl group, a substituted or unsubstituted biphenyl group, a substituted or unsubstituted terphenyl group, or a substituted or unsubstituted naphthyl group is preferred, and a substituted or unsubstituted phenyl group, a substituted or unsubstituted biphenyl group, a substituted or unsubstituted terphenyl group, a substituted or unsubstituted dibenzofuranyl group, a substituted or unsubstituted dibenzothiophenyl group is more preferred, and a substituted phenyl group is further preferred.

Further, in order to increase the bulk and improve the emission efficiency, the substituent group when $R^7$ is substituted is preferably a substituted or unsubstituted alkyl group, or a substituted or unsubstituted alkoxy group, and more preferably a methyl group, an ethyl group, an isopropyl group, a tert-butyl group, or a methoxy group. From the viewpoint of dispersibility, a tert-butyl group or a methoxy group is particularly preferred, and quenching due to aggregation of molecules is prevented.

In order to improve the stability with respect to electrons and improve the durability, the substituent group when $R^7$ is substituted is preferably an electron withdrawing group. Preferred examples of the electron withdrawing group include fluorine, fluorine-containing alkyl groups, substituted or unsubstituted acyl groups, substituted or unsubstituted ester groups, substituted or unsubstituted amide groups, substituted or unsubstituted sulfonyl groups, nitro groups, silyl groups, cyano groups, aromatic heterocyclic groups, and the like.

It is preferred that X is C—$R^7$ and $R^7$ is a substituted phenyl group, and that the substituted phenyl group is a phenyl group having in the ortho or meta position one selected from the group consisting of phenyl group, alkyl group, alkoxy group and halogen, or a phenyl group having a phenyl group in the para position, or a phenyl group having independently in the ortho and meta positions a group selected from the group consisting of phenyl group, alkyl group and alkoxy group, and having a ring structure formed from these selected groups. In this case, the overlapping of molecules is suppressed, and the fluorescence quantum yield is further improved. From the viewpoint of further enhancing this effect, it is more preferred that X is C—$R^7$ and $R^7$ is a substituted phenyl group, and that the substituted phenyl group is a phenyl group having in the ortho or meta position one selected from the group consisting of phenyl group, alkyl group, alkoxy group and halogen, or a phenyl group having independently in the ortho and meta positions a group selected from the group consisting of phenyl group, alkyl group and alkoxy group, and having a ring structure formed from the selected groups.

In the formulas (2A) to (2D), $R^{101}$ and $R^{102}$ are preferably substituted or unsubstituted alkyl groups, substituted or unsubstituted aryl groups, or substituted or unsubstituted heteroaryl groups. In this case, the compound represented by the general formula (1) exhibits better thermal stability and photostability. In particular, $R^{101}$ and $R^{102}$ are preferably substituted or unsubstituted alkyl groups and/or substituted or unsubstituted aryl groups because these groups have a small electronic effect on the pyrromethene-boron complex skeleton and result in a higher fluorescence quantum yield. Specific examples of the preferred substituent group include methyl groups, ethyl groups, isopropyl groups and tert-butyl groups as the alkyl groups, and phenyl groups as the aryl groups. From the viewpoint of easy synthesis and dispersibility, methyl groups and phenyl groups are particularly preferred, and with these groups, quenching due to aggregation of molecules is suppressed.

$R^{101}$ and $R^{102}$ may form a ring. The ring formation between $R^{101}$ and $R^{102}$ suppresses the structural relaxation, and sharp emission can be obtained. Moreover, since the thermal vibration of the entire molecule is suppressed, the thermal stability is improved. Preferred examples of the case where $R^{101}$ and $R^{102}$ form a ring include a case where they form a spirofluorene ring. Specifically, it is a structure in which $R^{101}$ and $R^{102}$, which are both benzene rings, form a ring. When both $R^{101}$ and $R^{102}$ are benzene rings, the electrical stability is improved, and the spiro structure improves further the stability of the vapor deposition.

One of $R^8$ and $R^9$ is preferably an alkyl group, an aryl group, a heteroaryl group, a fluorine atom, a fluorine-containing alkyl group, a fluorine-containing heteroaryl group, a fluorine-containing aryl group, a fluorine-containing alkoxy group, a fluorine-containing aryloxy group, or a cyano group, and preferably a fluorine atom, a fluorine-containing alkyl group, a fluorine-containing alkoxy group, or a fluorine-containing aryl group because the excited state is stable and a higher fluorescence quantum yield can be obtained, and more preferably fluorine from the viewpoint of easy synthesis.

Moreover, both $R^8$ and $R^9$ are preferably fluorine atoms. In this case, the excited state is stable, and a higher fluorescence quantum yield can be obtained, and in addition, the thermal stability is higher.

Moreover, one of $R^8$ and $R^9$ is preferably a cyano group. Since a cyano group has a strong electron withdrawing property, the electron density of the pyrromethene-boron complex skeleton can be lowered by introducing a cyano group as a substituent group on the boron of the pyrromethene-boron complex skeleton. As a result, the stability of the compound represented by the general formula (1) with respect to electrons can be further improved, and the durability can be further improved.

Moreover, both $R^8$ and $R^9$ are preferably cyano groups. The electron density of the pyrromethene-boron complex skeleton can be further lowered by introducing two cyano groups on the boron. As a result, the stability of the compound represented by the general formula (1) with respect to electrons can be further improved, and the durability can be improved significantly.

An example of the pyrromethene-boron complex of the present invention is shown below, but the present invention is not limited thereto.
[Chem 7]
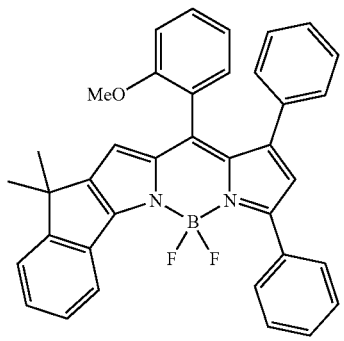
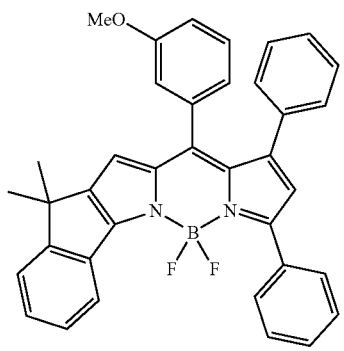
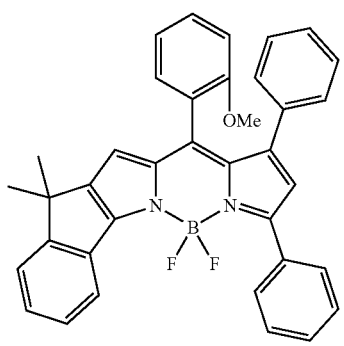
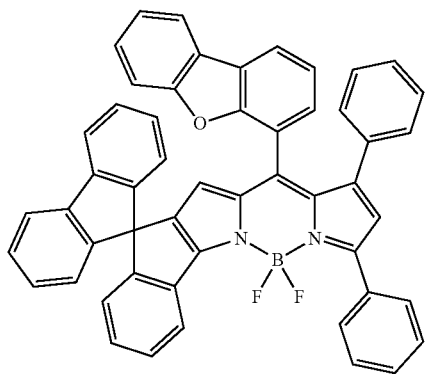
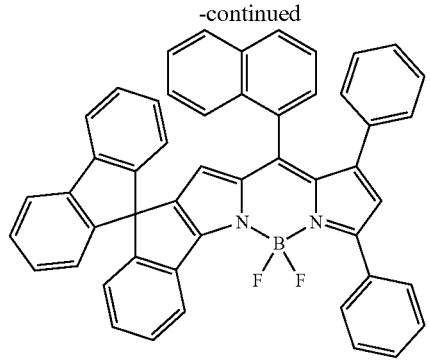
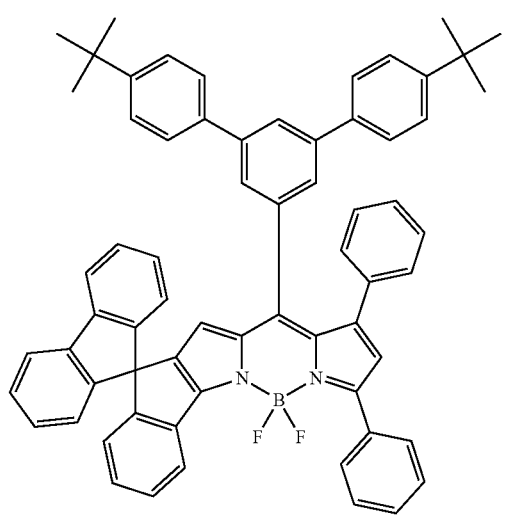
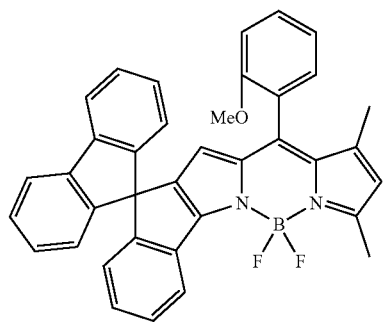
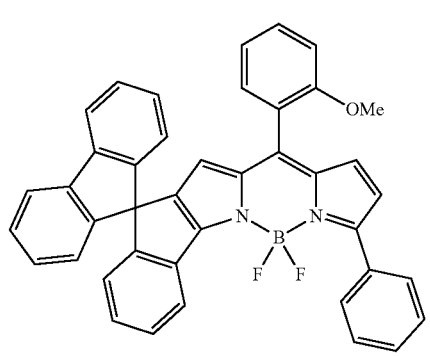

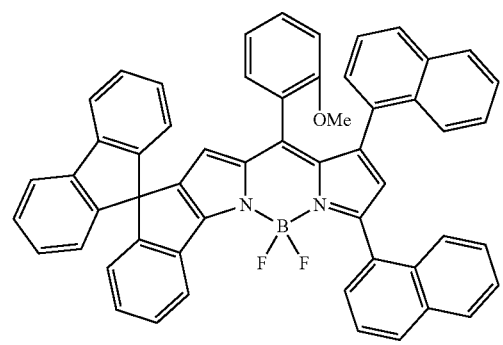
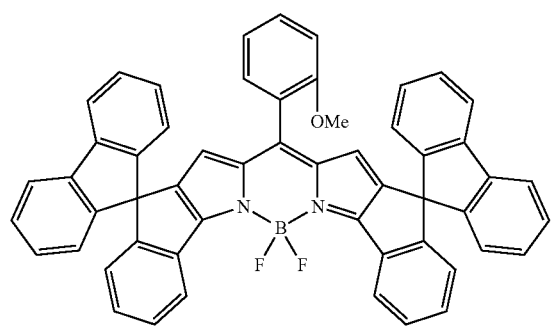
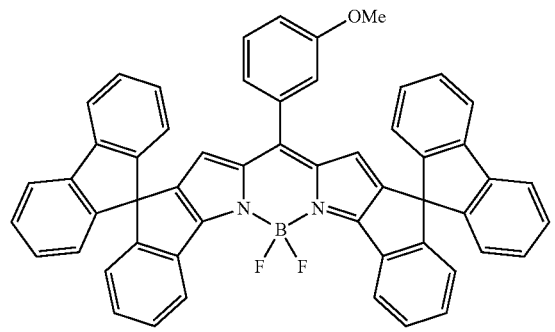
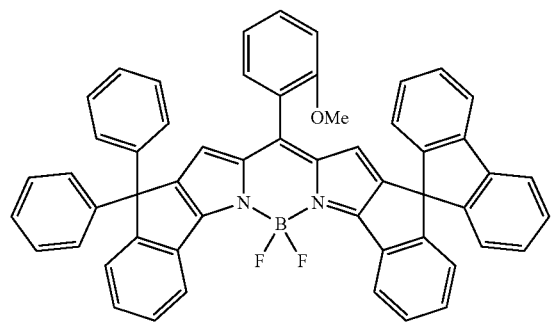
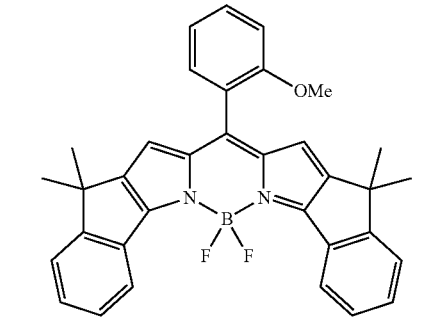

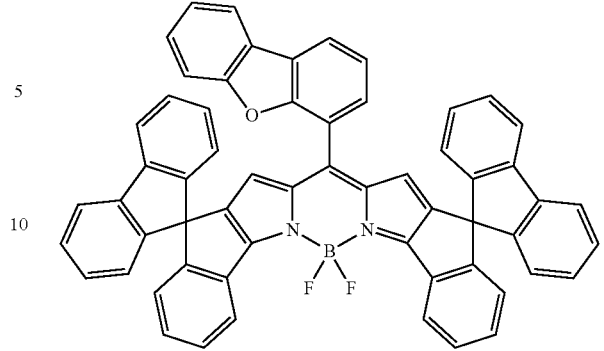
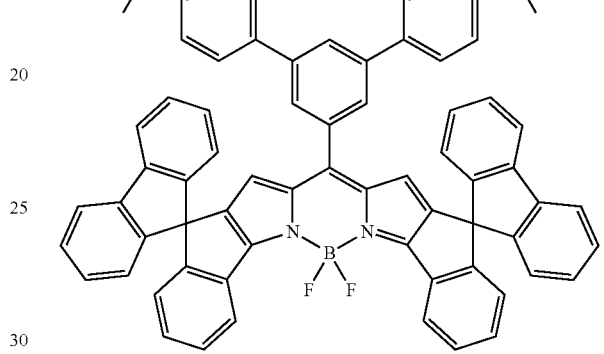
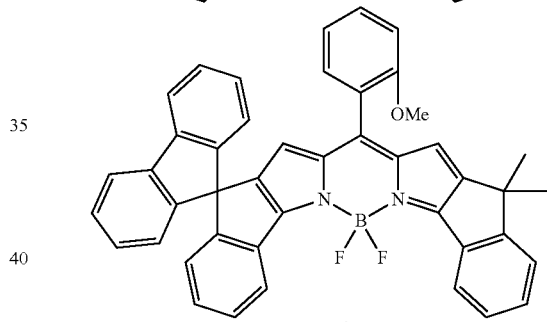
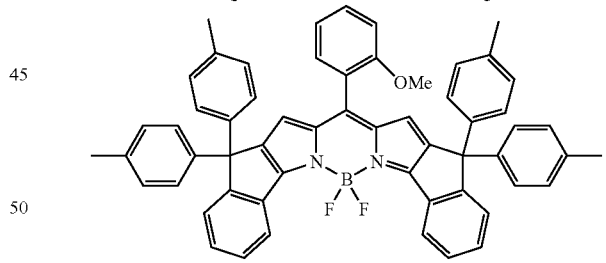

The pyrromethene-boron complex represented by the general formula (1) can be produced by reference to methods described in J. Org. Chem., vol. 64, No. 21, pp. 7813-7819 (1999), Angew. Chem., Int. Ed. Engl., vol. 36, pp. 1333-1335 (1997), Org. Lett., vol. 12, pp. 296 (2010), and the like. For example, the compound represented by the following general formula (5) and the compound represented by the general formula (6) are heated in 1,2-dichloroethane in the presence of phosphorus oxychloride, and then the compound represented by the following general formula (7) is reacted in 1,2-dichloroethane in the presence of triethylamine, but it is not limited to this method. $R^1$ to $R^9$ have the same meaning as described above. J represents a halogen.

[Chem 9]

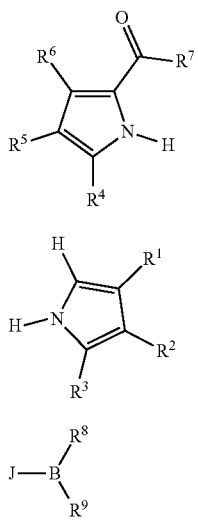

(5)

(6)

(7)

Further, when introducing an aryl group or a heteroaryl group, examples of the method include, but are not limited to, a method in which a carbon-carbon bond is formed by a coupling reaction between a halogenated derivative and a boronic acid or an esterified derivative of boronic acid. Similarly, when introducing an amino group or a carbazolyl group, examples of the method include, but are not limited to, a method in which a carbon-nitrogen bond is formed by a coupling reaction between a halogenated derivative and an amine or a carbazole derivative in the presence of a metal catalyst such as palladium.

The pyrromethene-boron complex according to the present invention preferably emits light observed in a region having a peak wavelength of 580 nm or more and 750 nm or less upon light excitation. Hereinafter, the emission observed in the region where the peak wavelength is 580 nm or more and 750 nm or less is referred to as "red emission".

The pyrromethene-boron complex according to the present invention preferably exhibits red emission upon the use of excitation light having a wavelength in the range of 430 nm or more and 580 nm or less. When the pyrromethene-boron complex according to an embodiment of the present invention is used as a dopant material for a light emitting element, the pyrromethene-boron complex according to the present invention exhibits red emission by absorbing light emitted from the host material. Since a general host material emits light having a wavelength in the range of 430 nm or more and 580 nm or less, if this excitation light can induce red emission, this contributes to high efficiency of the light emitting element.

Since the pyrromethene-boron complex according to the present invention can achieve both the high efficiency emission and high color purity, the pyrromethene-boron complex is preferably used as an electronic device material in an electronic device, and particularly preferably used as an as a light emitting element material or a photoelectric conversion element material in a light emitting element or a photoelectric conversion element.

Photoelectric Conversion Element Material

The photoelectric conversion element material means a material used in any layer of the photoelectric conversion element, and as described later, is a material used for a layer selected from a hole extraction layer, a photoelectric conversion layer, and an electron extraction layer. High conversion efficiency can be obtained when the pyrromethene-boron complex of the present invention is used in any layer of the photoelectric conversion element.

Photoelectric Conversion Element

The photoelectric conversion element has an anode and a cathode, and an organic layer interposed between them, and light energy is converted into an electric signal in the organic layer. The organic layer preferably has at least a photoelectric conversion layer, and the photoelectric conversion layer preferably contains a p-type material and an n-type material. The p-type material is an electron donating (donor) material, has a shallow HOMO energy level, and easily transports holes. The n-type material is an electron withdrawing (acceptor) material, has a deep LUMO energy level, and easily transports electrons. The p-type material and the n-type material may be laminated or mixed.

In addition to the structure comprising a photoelectric conversion layer alone, examples of the organic layer include laminated structures such as 1) a hole extraction layer/photoelectric conversion layer, 2) a photoelectric conversion layer/an electron extraction layer, and 3) a hole extraction layer/a photoelectric conversion layer/an electron extraction layer. The electron extraction layer is a layer provided so that electrons are easily extracted from the photoelectric conversion layer to the cathode, and is usually provided between the photoelectric conversion layer and the cathode. The hole extraction layer is a layer provided so that holes are easily extracted from the photoelectric conversion layer to the anode, and is usually provided between the anode and the photoelectric conversion layer. Each of the above layers may be either a single layer or a plurality of layers.

The pyrromethene-boron complex of the present invention may be used in any layer of the above photoelectric conversion element, but since the pyrromethene-boron complex has high electron affinity, thin film stability, and strong absorption in the visible light region, the pyrromethene-boron complex is preferably used in the photoelectric conversion layer. In particular, since the pyrromethene-boron complex has excellent electron transport ability, it is preferably used as an n-type material for the photoelectric conversion layer. Since the pyrromethene-boron complex of the present invention has a particularly high electron affinity, it can be also suitably used in an electron extraction layer. In this case, the efficiency of electron extraction from the photoelectric conversion layer to the cathode is increased, and the conversion efficiency can be thus improved.

The photoelectric conversion element can be used for an optical sensor. Furthermore, the photoelectric conversion element in this embodiment can also be used in a solar cell.

Light Emitting Element Material

The pyrromethene-boron complex of the present invention is preferably used as a light emitting element material. The light emitting element material in the present invention means a material used in any layer of the light emitting element, and, as described later, includes a material used for a hole injection layer, a hole transport layer, a light emitting layer, and/or an electron transport layer, and a material used for a protective film (cap layer) of the electrodes. A light emitting element with a high efficiency emission and high color purity can be obtained when the pyrromethene-boron complex of the present invention is used in any layer of the light emitting element.

Light Emitting Element

Embodiments of the light emitting element of the present invention will be described in detail. The organic thin film light emitting element has an anode and a cathode, and an organic layer interposed between the anode and the cathode, and the organic layer emits light by electric energy.

The layer structure between the anode and the cathode in such a light emitting element includes, in addition to the structure comprising a light emitting layer alone, a laminated structure such as 1) light emitting layer/electron transport layer, 2) hole transport layer/light emitting layer, 3) hole transport layer/light emitting layer/electron transport layer, 4) hole injection layer/hole transport layer/light emitting layer/electron transport layer, 5) hole transport layer/light emitting layer/electron transport layer/electron injection layer, 6) hole injection layer/hole transport layer/light emitting layer/electron transport layer/electron injection layer, and 7) hole injection layer/hole transport layer/light emitting layer/hole blocking layer/electron transport layer/electron injection layer.

A plurality of the above laminated structures may be laminated via an intermediate layer to form a tandem type. The intermediate layer is generally referred to as an intermediate electrode, an intermediate conductive layer, a charge generation layer, an electron extraction layer, a connection layer, or an intermediate insulating layer, and a known material structure can be used. Specific examples of the tandem type include laminated structures containing a charge generation layer as an intermediate layer between the anode and the cathode, such as 8) hole transport layer/light emitting layer/electron transport layer/charge generation layer/hole transport layer/light emitting layer/electron transport layer, 9) hole injection layer/hole transport layer/light emitting layer/electron transport layer/electron injection layer/charge generation layer/hole injection layer/hole transport layer/light emitting layer/electron transport layer/electron injection layer. Specifically, a pyridine derivative and a phenanthroline derivative are preferably used as the material constituting the intermediate layer.

Each of the above layers may be either a single layer or a plurality of layers, and may be doped. For each of the above layers, an element structure that contains an anode, one or more organic layers including a light emitting layer, and a cathode, and further a layer using a capping material for improving emission efficiency by the optical interference effect is also included.

The pyrromethene-boron complex of the present invention may be used in any layer of the above element structures, but since the pyrromethene-boron complex has a high fluorescence quantum yield and thin film stability, the pyrromethene-boron complex is preferably used in the light emitting layer of the light emitting element. In particular, since the pyrromethene-boron complex has excellent fluorescence quantum yield, it is preferably used as a dopant material for the light emitting layer.

In the light emitting element of the present invention, the anode and the cathode have a role of supplying a sufficient current for emission of the element, and at least one of them is desirably transparent or semi-transparent in order to extract light. Usually, the anode formed on the substrate is a transparent electrode.

Furthermore, the light emitting element is preferably a top-emission organic electroluminescent element. In the case of a top-emission organic electroluminescent element, for example, the anode has a laminated structure of a reflective electrode layer and a transparent electrode layer, and the film thickness of the transparent electrode layer on the reflective electrode layer is changed. An organic layer is appropriately laminated on the anode, and then, in the cathode, a thin-film semi-transparent silver or the like as an example is used as the semi-transparent electrode, thereby introducing a microcavity structure in the organic electroluminescent element. When a microcavity structure is introduced in the organic electroluminescent element in this way, the spectrum of the light emitted from the organic layer and emitted through the cathode is steeper than when the organic electroluminescent element does not have the microcavity structure, and the injection strength to the front is greatly increased. The use of this in a display contributes to the improvement of color gamut and brightness.

Substrate

In order to maintain the mechanical strength of the light emitting element, the light emitting element is preferably formed on a substrate. As the substrate, a glass substrate such as soda glass or non-alkali glass is suitably used. The thickness of the glass substrate needs to be sufficient to maintain the mechanical strength, and therefore 0.5 mm or more is sufficient. As the material of the glass, since it is preferred that the amount of eluted ions from the glass is small, non-alkali glass is preferred. Soda-lime glass coated with a barrier coat such as $SiO_2$ is also commercially available, and can be used. Further, as long as the first electrode formed on the substrate functions stably, the substrate does not have to be glass, and may be, for example, a plastic substrate.

Anode

The material used for the anode is a material that can efficiently inject holes into the organic layer and is transparent or semi-transparent to extract light, and thus is not particularly limited. Examples thereof include conductive metal oxides such as zinc oxide, tin oxide, indium oxide, indium tin oxide (ITO), and indium zinc oxide (IZO), metals such as gold, silver and chromium, inorganic conductive substances such as copper iodide and copper sulfide, conductive polymers such as polythiophenes, polypyrroles and polyanilines, and the like. The ITO glass or Nesa glass are particularly desirable. These electrode materials may be used alone, or a plurality of these materials may be laminated or mixed. The resistance of the transparent electrode is not limited as long as a sufficient current for emission of the element can be supplied, but desirably is low from the viewpoint of the power consumption of the element. For example, an ITO substrate of 300Ω/□ or less functions as an element electrode, but since it is now possible to supply a substrate of about 10Ω/□, the use of a substrate with a low resistance of 20Ω/□ or less is especially desirable. The thickness of ITO can be arbitrarily selected according to the resistance value, and is usually used in the range of 45 to 300 nm.

Cathode

The material used for the cathode is not particularly limited as long as it is a substance capable of efficiently injecting electrons into the light emitting layer. Generally, metals such as platinum, gold, silver, copper, iron, tin, aluminum, indium, alloys and multilayered laminates of these metals with metals of low-work function such as lithium, sodium, potassium, calcium, and magnesium are preferred. Among these, as main components, aluminum, silver, and magnesium are preferred from the viewpoint of electrical resistance, ease of film formation, film stability, emission efficiency, and the like. In particular, the composition of magnesium and silver is preferred because electron injection into the electron transport layer and the electron injection layer in the present invention is facilitated and low voltage drive is thus possible.

Protective Film Layer

To protect the cathode, a protective film layer (cap layer) is preferably laminated on the cathode. The material constituting the protective film layer is not particularly limited, and examples thereof include metals such as platinum, gold, silver, copper, iron, tin, aluminum and indium, alloys using these metals, inorganic substances such as silica, titania and silicon nitride, organic polymer compounds such as polyvinyl alcohol, polyvinyl chloride, hydrocarbon polymer compounds, and the like. The pyrromethene-boron complex of the present invention can also be used as this protective film layer. However, when the light emitting element has an element structure in which light is extracted from the cathode side (top-emission structure), the material used for the protective film layer is selected from materials which transmit light in the visible light region.

Hole Injection Layer

The hole injection layer is a layer inserted between the anode and the hole transport layer. The hole injection layer may be a single layer or a plurality of laminated layers. The hole injection layer is preferably present between the hole transport layer and the anode because driving at a lower voltage is possible and the durability life is improved. Furthermore, the carrier balance of the element is also improved, which results in improved emission efficiency.

The material used for the hole injection layer is not particularly limited, and examples thereof to be used include benzidine derivatives such as 4,4'-bis(N-(3-methylphenyl)-N-phenylamino)biphenyl (TPD), 4,4'-bis(N-(1-naphthyl)-N-phenylamino)biphenyl (NPD), 4,4'-bis(N,N-bis(4-biphenylyl)amino)biphenyl (TBDB), and bis(N,N'-diphenyl-4-aminophenyl)-N,N-diphenyl-4,4'-diamino-1,1'-biphenyl (TPD232), a group of materials called starburst arylamines such as 4,4',4"-tris(3-methylphenyl(phenyl)amino)triphenylamine (m-MTDATA), 4,4',4"-tris(1-naphthyl(phenyl)amino)triphenylamine (1-TNATA), biscarbazole derivatives such as bis(N-arylcarbazole) or bis(N-alkylcarbazole), pyrazoline derivatives, stilbene compounds, hydrazone compounds, heterocyclic compounds such as benzofuran derivatives, thiophene derivatives, oxadiazole derivatives, phthalocyanine derivatives, and porphyrin derivatives, and polymers such as polycarbonate and styrene derivative having the above monomers in the side chain, polythiophenes, polyanilines, polyfluorenes, polyvinylcarbazoles, polysilanes and the like. Further, a compound represented by the general formula (1) can also be used. Among them, the benzidine derivatives and the starburst arylamine material group are more preferably used because they have a shallower HOMO energy level than the compound represented by the general formula (1) and smoothly inject and transport holes from the anode to the hole transport layer.

These materials may be used alone or in combination of two or more kinds of materials. Further, a plurality of materials may be laminated to form a hole injection layer. It is more preferred that the hole injection layer is made of an acceptor compound alone, or that the hole injection material as described above is doped with an acceptor compound, because the above-described effect is more remarkably observed. When used as a mono-layer film, the acceptor compound is a material that forms a charge transfer complex with a hole transport layer which is in contact with the acceptor compound. When doped, the acceptor compound is a material that forms a charge transfer complex with the material that constitutes the hole injection layer. When such materials are used, the conductivity of the hole injection layer is improved, which further contributes to a decrease in the driving voltage of the element, and effects such as improved emission efficiency and durability life can be obtained.

Examples of acceptor compounds include metal chlorides such as iron(III) chloride, aluminum chloride, gallium chloride, indium chloride and antimony chloride, metal oxides such as molybdenum oxide, vanadium oxide, tungsten oxide and ruthenium oxide, and charge transfer complexes such as tris(4-bromophenyl)aminiumhexachloroantimonate (TBPAH). Furthermore, organic compounds having a nitro group, a cyano group, a halogen or a trifluoromethyl group in the molecule, quinone compounds, acid anhydride compounds, fullerenes and the like can be also suitably used. Specific examples of these compounds include hexacyanobutadiene, hexacyanobenzene, tetracyanoethylene, tetracyanoquinodimethane (TCNQ), tetrafluorotetracyanoquinodimethane (F4-TCNQ), radialene derivatives, p-fluoranil, p-chloranil, p-bromanil, p-benzoquinone, 2,6-dichlorobenzoquinone, 2,5-dichlorobenzoquinone, tetramethylbenzoquinone, 1,2,4,5-tetracyanobenzene, o-dicyanobenzene, p-dicyanobenzene, 1,4-dicyanotetrafluorobenzene, 2,3-dichloro-5,6-dicyanobenzoquinone, p-dinitrobenzene, m-dinitrobenzene, o-dinitrobenzene, p-cyanonitrobenzene, m-cyanonitrobenzene, o-cyanonitrobenzene, 1,4-naphthoquinone, 2,3-dichloronaphthoquinone, 1-nitronaphthalene, 2-nitronaphthalene, 1,3-dinitronaphthalene, 1,5-dinitronaphthalene, 9-cyanoanthracene, 9-nitroanthracene, 9,10-anthraquinone, 1,3,6,8-tetranitrocarbazole, 2,4,7-trinitro-9-fluorenone, 2,3,5,6-tetracyanopyridine, maleic anhydride, phthalic anhydride, C60, C70 and the like.

Among these, metal oxides and cyano group-containing compounds are preferred because they are easy to handle and easy to vapor-deposit, which can easily result the above-described effects. Whether the hole injection layer is made of the acceptor compound alone or doped with the acceptor compound, the hole injection layer may be a single layer, or a plurality of layers may be laminated to form the structure.

Hole Transport Layer

The hole transport layer is a layer that transports holes injected from the anode to the light emitting layer. The hole transport layer may be a single layer, or a plurality of layers may be laminated to form the structure.

The hole transport layer is formed by a method of laminating or mixing one or more kinds of hole transport materials, or a method of using a mixture of a hole transport material and a polymer binder. In addition, the hole transport material needs to efficiently transport holes from the anode between electrodes to which an electric field is applied. It is preferred that the hole transport material is highly efficient in hole injection and efficiently transports the injected holes. For this purpose, the hole transport material is required to be a substance having an appropriate ionization potential, a high hole mobility, excellent stability, and less likely to generate impurities, which become traps, during production and use.

Substances satisfying such conditions are not particularly limited, but examples thereof include benzidine derivatives such as 4,4'-bis(N-(3-methylphenyl)-N-phenylamino)biphenyl (TPD), 4,4'-bis(N-(1-naphthyl)-N-phenylamino)biphenyl (NPD), 4,4'-bis(N,N-bis(4-biphenylyl)amino)biphenyl (TBDB), and bis(N,N'-diphenyl-4-aminophenyl)-N,N-diphenyl-4,4'-diamino-1,1'-biphenyl (TPD232), a group of materials called starburst arylamines such as 4,4',4''-tris(3-methylphenyl(phenyl)amino)triphenylamine (m-MTDATA), 4,4',4'''-tris(1-naphthyl(phenyl)amino)triphenylamine (1-TNATA), biscarbazole derivatives such as bis(N-arylcarbazole) or bis (N-alkylcarbazole), pyrazoline derivatives, stilbene compounds, hydrazone compounds, heterocyclic compounds such as benzofuran derivatives, thiophene derivatives, oxadiazole derivatives, phthalocyanine derivatives, and porphyrin derivatives, and polymers such as polycarbonate and styrene derivative having the above monomers in the side chain, polythiophenes, polyanilines, polyfluorenes, polyvinylcarbazoles, polysilanes and the like.

Light Emitting Layer

The light emitting layer may be either a single layer or a plurality of layers, and each is formed of a fluorescent material (host material, dopant material). The light emitting layer may be a mixture of the host material and the dopant material, the host material alone, or a mixture of two kinds of host materials and one kind of dopant material. That is, in the light emitting element of the present invention, only the host material or only the dopant material may emit light in each light emitting layer, or both of the host material and the dopant material may emit light. From the viewpoint of utilizing efficiently electric energy and obtaining emission with high color purity, the light emitting layer is preferably made of a mixture of a host material and a dopant material. Further, the host material and the dopant material may be either one kind or a combination of several kinds. The dopant material may be contained entirely or partially in the host material. The dopant material may be laminated or dispersed. The dopant material can control the emission color. When the amount of the dopant material is too large, a concentration quenching phenomenon occurs. Therefore, the dopant material is preferably used in an amount of 30% by mass or less, more preferably 20% by mass or less, with respect to the host material. The doping method can be a co-vapor deposition method with the host material, or the dopant material may be mixed with the host material in advance and then vapor-deposited at the same time.

Fluorescent materials which can be used include, but are not particularly limited to, fused ring derivatives such as anthracene and pyrene, which have been conventionally known as fluorophores, metal-chelated oxinoid compounds such as tris(8-quinolinolate)aluminum, bisstyryl derivatives such as bisstyryl anthracene derivatives and distyrylbenzene derivatives, tetraphenylbutadiene derivatives, indene derivatives, coumarin derivatives, oxadiazole derivative, pyrolopyridine derivatives, perinone derivatives, cyclopentadiene derivatives, oxadiazole derivatives, thiadiazolopyridine derivatives, dibenzofuran derivatives, carbazole derivatives, indolocarbazole derivatives, polymers such as polyphenylene vinylene derivatives, polyparaphenylene derivatives, and polythiophene derivatives.

Since the pyrromethene-boron complex of the present invention also has a high fluorescence quantum yield and is excellent in electrochemical stability, so the pyrromethene-boron complex of the present invention can be used as a fluorescent material. The pyrromethene-boron complex of the present invention may be used as a host material, but due to its strong electron affinity, the pyrromethene-boron complex is preferably used as a dopant material because the pyrromethene-boron complex has an effect of trapping excess electrons injected into the light emitting layer, and thus can prevent the hole transport layer from being deteriorated by the attack of electrons.

The host material contained in the fluorescent material is not limited to only one kind of compound, and a plurality of pyrromethene-boron complexes of the present invention may be mixed and used, or one or more kinds of other host materials may be mixed and used. Further, the host materials may be laminated and used. The host material is not particularly limited, but examples thereof include, but are not particularly limited to, compounds having a fused aryl ring such as naphthalene, anthracene, phenanthrene, pyrene, chrysene, naphthacene, triphenylene, perylene, fluoranthene, fluorene, and indene, and derivatives thereof, aromatic amine derivatives such as N,N'-dinaphthyl-N,N'-diphenyl-4,4'-diphenyl-1,1'-diamine, metal-chelated oxinoid compounds such as tris(8-quinolinate)aluminum(III), bisstyryl derivatives such as distyrylbenzene derivatives, tetraphenylbutadiene derivatives, indene derivatives, coumarin derivatives, oxadiazole derivatives, pyrolopyridine derivatives, perinone derivatives, cyclopentadiene derivatives, pyrolopyrrole derivatives, thiadiazolopyridine derivatives, dibenzofuran derivatives, carbazole derivatives, indolocarbazole derivatives, triazine derivatives, polymers such as polyphenylene vinylene derivatives, polyparaphenylene derivatives, polyfluorene derivatives, polyvinylcarbazole derivatives, polythiophene derivatives and the like. Among them, as the host materials which are used when the light emitting layer shows triple state emission (phosphorescent emission), metal chelated oxinoid compounds, dibenzofuran derivatives, dibenzothiophene derivatives, carbazole derivatives, indolocarbazole derivatives, triazine derivatives, triphenylene derivatives and the like are suitably used. Anthracene derivatives or naphthacene derivatives are particularly preferred.

The dopant material contained in the fluorescent material is not particularly limited, and examples thereof include, in addition to the compound represented by the general formula (1), compounds having an aryl ring such as naphthalene, anthracene, phenanthrene, pyrene, fluoranthene, triphenylene, perylene, fluorene, and indene, and derivatives thereof (for example, 2-(benzothiazole-2-yl)-9,10-diphenylanthracene, 5,6,11,12-tetraphenylnaphthacene, and the like), compounds having a heteroaryl ring such as furan, pyrrole, thiophene, silole, 9-silafluorene, 9,9'-spirobisilafluorene, benzothiophene, benzofuran, indols, dibenzothiophene, dibenzofuran, imidazopyridine, phenanthroline, pyrazine, naphthylidine, quinoxaline, pyrolopyridine, and thioxanthene, and derivatives thereof, distyrylbenzene derivatives, aminostyryl derivatives such as 4,4'-bis(2-(4-diphenylaminophenyl)ethenyl)biphenyl, 4,4'-bis(N-(stilben-4-yl)-N-phenylamino)stilbene, aromatic acetylene derivatives, tetraphenylbutadiene derivatives, stilbene derivatives, aldazine derivatives, pyrromethene derivatives, diketopyrrolo[3,4-c]pyrrole derivatives, coumarin derivatives such as 2,3,5,6-1H,4H-tetrahydro-9-(2'-benzothiazolyl)quinolizino[9,9a,1-gh]coumarin, azole derivatives such as imidazole, thiazole, thiadiazole, carbazole, oxazole, oxadiazole, triazole and their metal complexes, aromatic amine derivatives represented by N,N'-diphenyl-N,N'-di(3-methylphenyl)-4,4'-diphenyl-1,1'-diamine, and the like. Among them, a dopant containing a diamine skeleton or a dopant containing a fluoranthene skeleton is preferably used because high efficiency emission can be easily obtained. Dopants containing a diamine skeleton have a high hole trapping property, and dopants containing a fluoranthene skeleton have a high electron trapping property.

The dopant which is used when the light emitting layer shows triple state emission (phosphorescent emission) is preferably a metal complex compound containing at least one metal selected from the group consisting of iridium (Ir), ruthenium (Ru), palladium (Pd), platinum (Pt), osmium (Os), and rhenium (Re). The ligand preferably has a nitrogen-containing aromatic heterocycle such as a phenylpyridine skeleton or a phenylquinoline skeleton or a carbene skeleton. However, the complex is not limited to these, and an appropriate complex is selected based on the required emission color, element performance, and relationship with the host compound. Specific examples include a tris(2-phenylpyridyl)iridium complex, a tris{2-(2-thiophenyl)pyridyl}iridium complex, a tris{2-(2-benzothiophenyl)pyridyl}iridium complex, a tris(2-phenylbenzothiazole)iridium complex, a tris(2-phenylbenzoxazole)iridium complex, a trisbenzoquinoline iridium complex, a bis(2-phenylpyridyl)(acetylacetonate)iridium complex, a bis{2-(2-thiophenyl)pyridyl}iridium complex, a bis{2-(2-benzothiophenyl)pyridyl}(acetylacetonate)iridium complex, a bis(2-phenylbenzothiazole)(acetylacetonate)iridium complex, a bis(2-phenylbenzoxazole)(acetylacetonate)iridium complex, a bisbenzoquinoline(acetylacetonate)iridium complex, a bis{2-(2,4-difluorophenyl)pyridyl}(acetylacetonate)iridium complex, a tetraethylporphyrin platinum complex, a {tris(thenoyltrifluoroacetone)mono(1,10-phenanthroline)}europium complex, a {tris(thenoyltrifluoroacetone)mono(4,7-diphenyl-1,10-phenanthroline)}europium complex, a {tris(1,3-diphenyl-1,3-propanedione)mono(1,10-phenanthroline)}europium complex, a trisacetylacetone terbium complex and the like. Further, the phosphorescent dopant described in JP2009-130141A is also suitably used. An iridium complex or a platinum complex is preferably used, but not limited thereto, because high efficiency emission can be easily obtained.

For the above triplet state phosphorescent material used as a dopant material, only one kind thereof may be contained in the light emitting layer, or two or more kinds may be mixed and used. When two or more kinds of triplet state phosphorescent material are used, the total mass of the dopant material is preferably 30% by mass or less, more preferably 20% by mass or less, with respect to the host material.

In addition to the above-described host materials and triplet fluorescent materials, the light emitting layer may further contain a third component for adjusting the carrier balance in the light emitting layer or for stabilizing the layer structure of the light emitting layer. As the third component, a material that does not cause an interaction with the host material and the dopant material is selected.

Preferred hosts and dopants in the triplet state emission system are not particularly limited, but specific examples include the following ones.

[Chem 10]

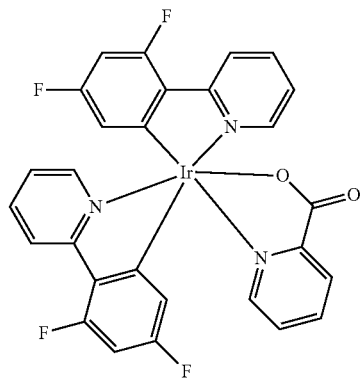

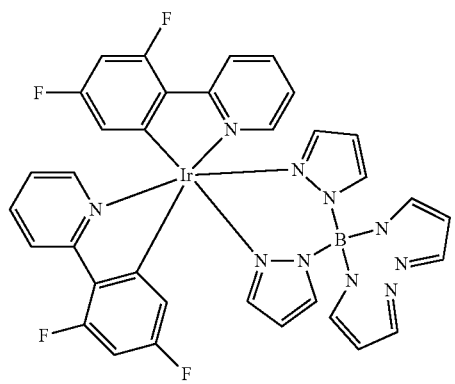

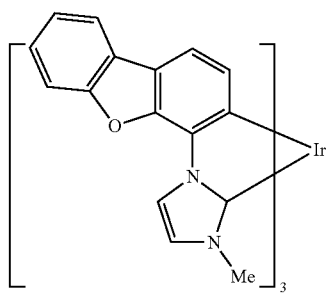

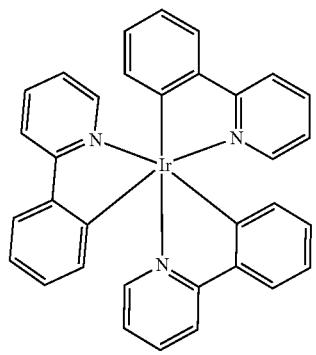

31
-continued
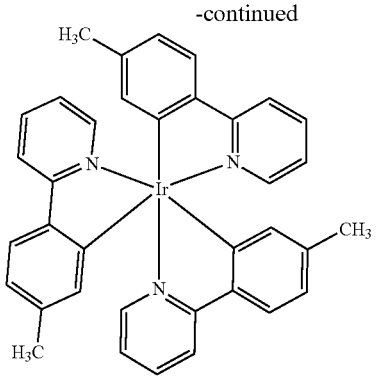
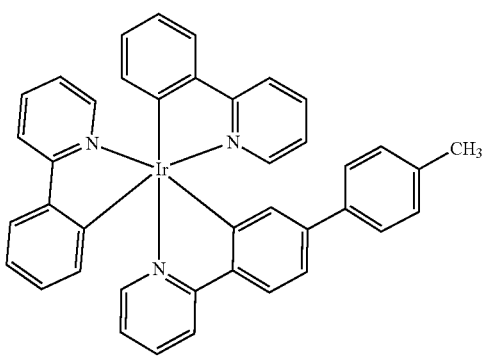
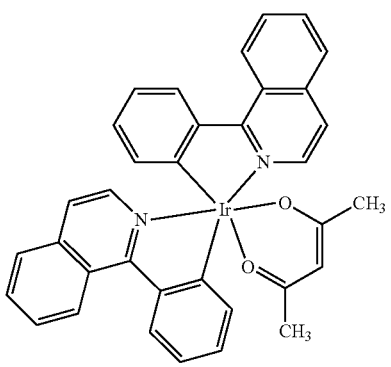
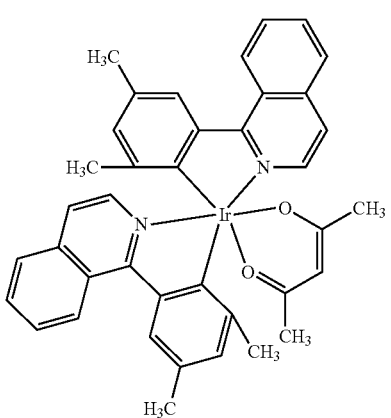
32
-continued
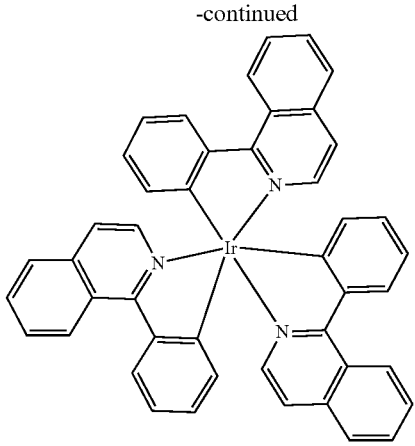
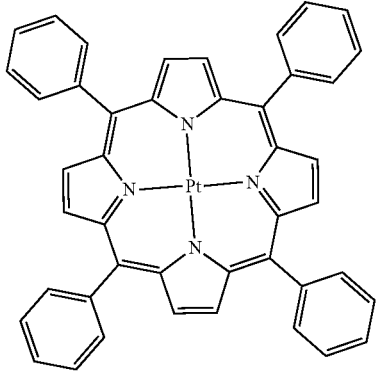
[Chem 11]
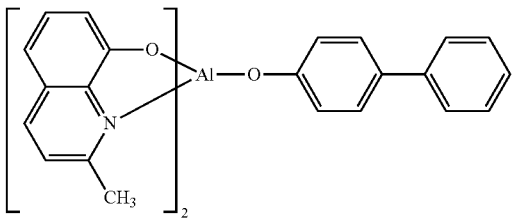
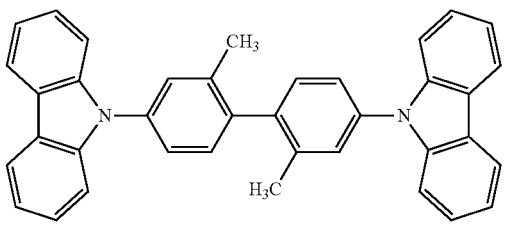
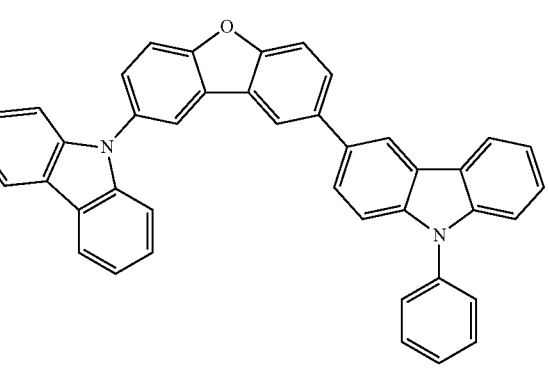

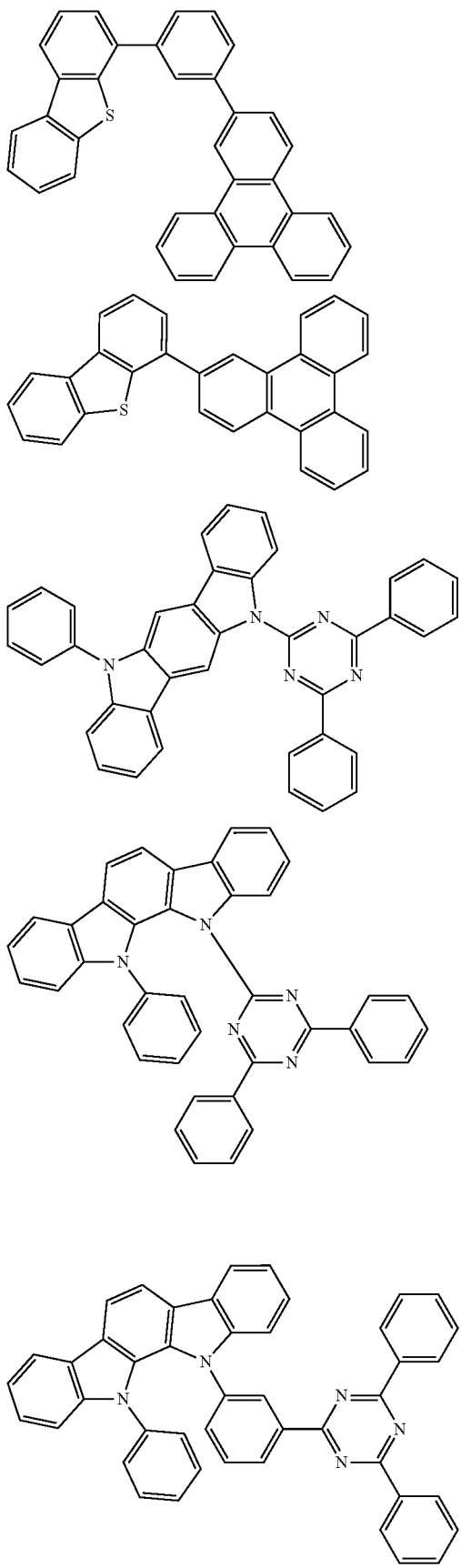
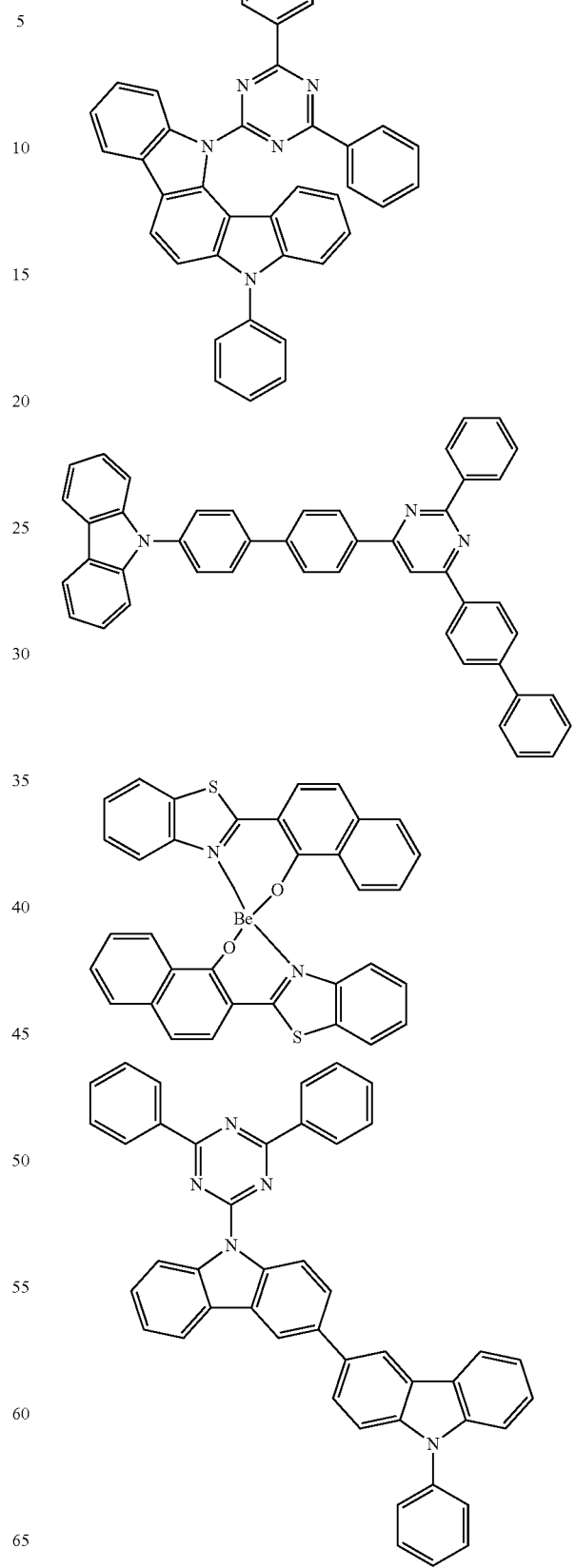

-continued

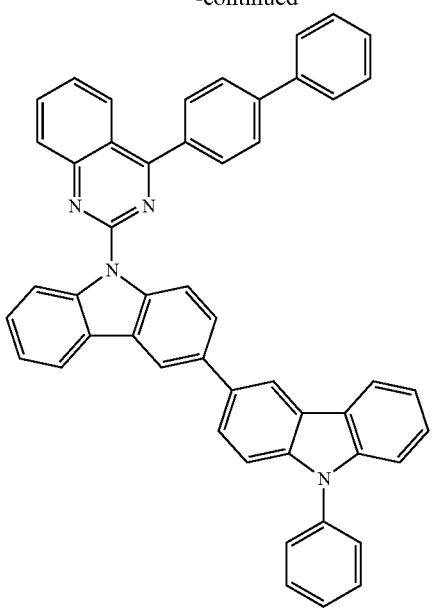

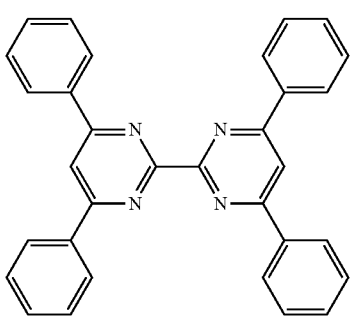

-continued

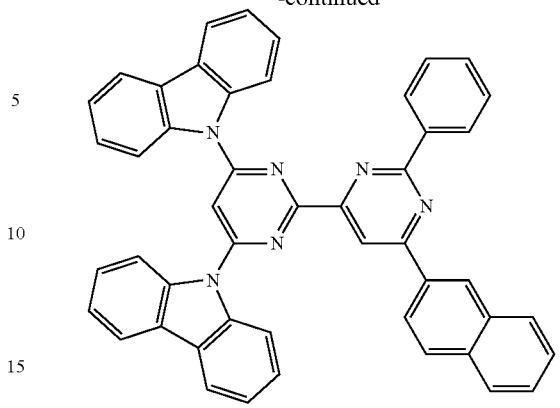

The light emitting element of the present invention preferably contains a thermally activated delayed fluorescence material in the light emitting layer. The thermally activated delayed fluorescence material is also generally called a TADF material (Thermally Activated Delayed fluorescence), and is a material that promotes the reverse intersystem crossing from a triplet excited state to a singlet excited state by reducing the energy gap between the energy level of the singlet excited state and the energy level of the triplet excited state, and thus improves the probability of singlet exciton generation. When the light emitting layer contains a thermally activated delayed fluorescence material, higher efficiency emission is possible, which contributes to lower power consumption of the display. The thermally activated delayed fluorescence material may be a single material that exhibits thermally activated delayed fluorescence, or may be a plurality of materials that exhibit thermally activated delayed fluorescence.

The thermally activated delayed fluorescence material to be used may be a single material or a plurality of materials, and known materials can be used. Specific examples thereof include benzonitrile derivatives, triazine derivatives, disulfoxide derivatives, carbazole derivatives, indolocarbazole derivatives, dihydrophenazine derivatives, thiazole derivatives, and oxadiazole derivatives.

Electron Transport Layer

In the present invention, the electron transport layer is a layer that injects electrons from the cathode and then transports the electrons. It is desired that the electron transport layer has high electron injection efficiency and transports efficiently the injected electrons. Therefore, the electron transport layer is required to be a substance which has a high electron affinity, a high degree of electron transfer, and excellent stability, and which is less likely to generate impurities, which become traps, during production and use. In particular, when the film laminated is thick, a compound having a not so high molecular weight is crystallized for example and the film quality is easily deteriorated. Thus, a compound having a molecular weight of 400 or more is preferred. However, in consideration of the transport balance between holes and electrons, if the electron transport layer mainly plays a role in efficiently preventing the holes from the anode which fail to recombine from flowing to the cathode side, even the electron transport layer made of a material having a low electron transport capacity is equivalent to that made of a material having a high electron transport capacity in terms of the effect of improving the emission efficiency. Therefore, the electron transport layer in the present invention also includes as a synonym a hole blocking layer capable of efficiently blocking the transfer of holes, and the hole blocking layer and the electron transport layer may be formed of one material alone or of a plurality of materials.

Examples of the electron transport materials used for the electron transport layer include fused polycyclic aromatic derivatives such as naphthalene and anthracene, styryl aromatic ring derivatives represented by 4,4'-bis(diphenylethenyl)biphenyl, quinone derivatives such as anthraquinone and diphenoquinone, phosphorus oxide derivatives, various metal complexes such as quinolinol complexes including tris(8-quinolinolate)aluminum(III), benzoquinolinol complexes, hydroxyazole complexes, azomethine complexes, tropolone metal complexes and flavonol metal complexes. A compound which is constituted by elements selected from carbon, hydrogen, nitrogen, oxygen, silicon, and phosphorus and has a heteroaryl ring structure containing electron-accepting nitrogen is preferably used because the driving voltage is reduced, and high efficiency emission can be obtained.

The electron-accepting nitrogen herein represents a nitrogen atom forming a multiple bond with an adjacent atom. Since the nitrogen atom is highly electronegative, the multiple bond has an electron-accepting property. Therefore, aromatic heterocycles containing electron-accepting nitrogen have high electron affinity. An electron transport material having electron-accepting nitrogen facilitates the reception of electrons from the cathode having a high electron affinity, resulting in the driving at lower voltage. In addition, the supply of electrons to the light emitting layer is increased, and the recombination probability is increased. Thus, the emission efficiency is improved.

Examples of the heteroaryl ring containing electron-accepting nitrogen include triazine rings, pyridine rings, pyrazine rings, pyrimidine rings, quinoline rings, quinoxaline rings, quinazoline rings, naphthylidine rings, pyrimidopyrimidine rings, benzoquinoline rings, phenanthroline rings, imidazole rings, oxazole rings, oxaziazole rings, triazole rings, thiazole rings, thiaziazole rings, benzoxazole rings, benzothiazole rings, benzimidazole rings, phenanthroimidazole rings, and the like.

Preferred examples of compounds having these heteroaryl ring structures include pyridine derivatives, triazine derivatives, quinazoline derivatives, pyrimidine derivatives, benzimidazole derivatives, benzoxazole derivatives, benzothiazole derivatives, oxadiazole derivatives, thiadiazole derivatives, triazole derivatives, pyrazine derivatives, phenanthroline derivatives, quinoxaline derivatives, quinoline derivatives, benzoquinoline derivatives, oligopyridine derivatives such as bipyridine and terpyridine, quinoxalin derivatives, naphthyridine derivatives and the like. Among them, imidazole derivatives such as tris(N-phenylbenzimidazol-2-yl)benzene, oxadiazole derivatives such as 1,3-bis[(4-tert-butylphenyl)1,3,4-oxadiazolyl]phenylene, triazole derivatives such as N-naphthyl-2,5-diphenyl-1,3,4-triazole, phenanthroline derivatives such as bathocuproine and 1,3-bis(1,10-phenanthroline-9-yl)benzene, benzoquinoline derivatives such as 2,2'-bis(benzo[h]quinoline-2-yl)-9,9'-spirobifluorene, bipyridine derivatives such as 2,5-bis(6'-(2',2"-bipyridyl))-1,1-dimethyl-3,4-diphenylsilole, terpyridine derivatives such as 1,3-bis(4'-(2,2':6'2"-terpyridinyl))benzene and naphthyridine derivatives such as bis(1-naphthyl)-4-(1,8-naphthylidine-2-yl)phenylphosphine oxide are preferably used from the viewpoint of electron transport ability.

Further, these derivatives more preferably have a fused polycyclic aromatic skeleton because the glass transition temperature is improved, and the degree of electron transfer is also increased, resulting in a larger effect of lowering the voltage of the light emitting element. In addition, considering the improved durability life of the element, easy synthesis, and the easy availability of raw materials, the fused polycyclic aromatic skeleton is more preferably a fluoranthene skeleton, an anthracene skeleton, pyrene skeleton or phenanthroline skeleton, and particularly preferably a fluoranthene skeleton or a phenanthroline skeleton.

The compound having a fluoranthene skeleton is more preferably a compound having a fluoranthene skeleton and an amino group in order to enhance the deep LUMO energy of the fluoranthene skeleton.

The compound having a phenanthroline skeleton preferably has a plurality of phenanthroline skeletons in the molecule in order to disperse charges and accelerate the electron transfer.

The compound having a heteroaryl ring structure containing electron-accepting nitrogen has a deep HOMO energy level, and is therefore preferably used as a hole blocking layer. It is particularly preferred in the light emitting element according to an embodiment of the present invention that a hole blocking layer is present between the light emitting layer and the cathode, and that the hole blocking layer contains a triazine derivative, a quinazoline derivative or a pyrimidine derivative.

Preferred electron transport materials are not particularly limited, but specific examples include the following ones.

[Chem 12]

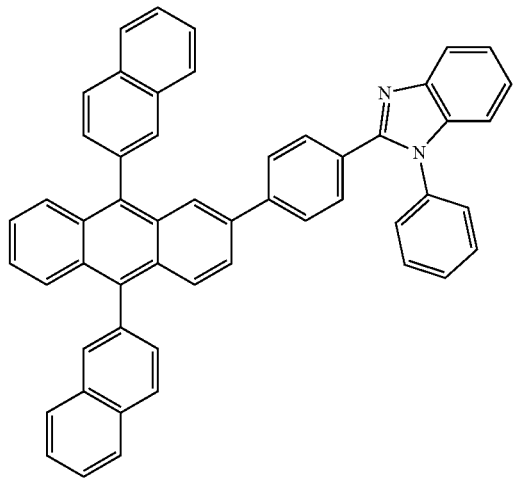

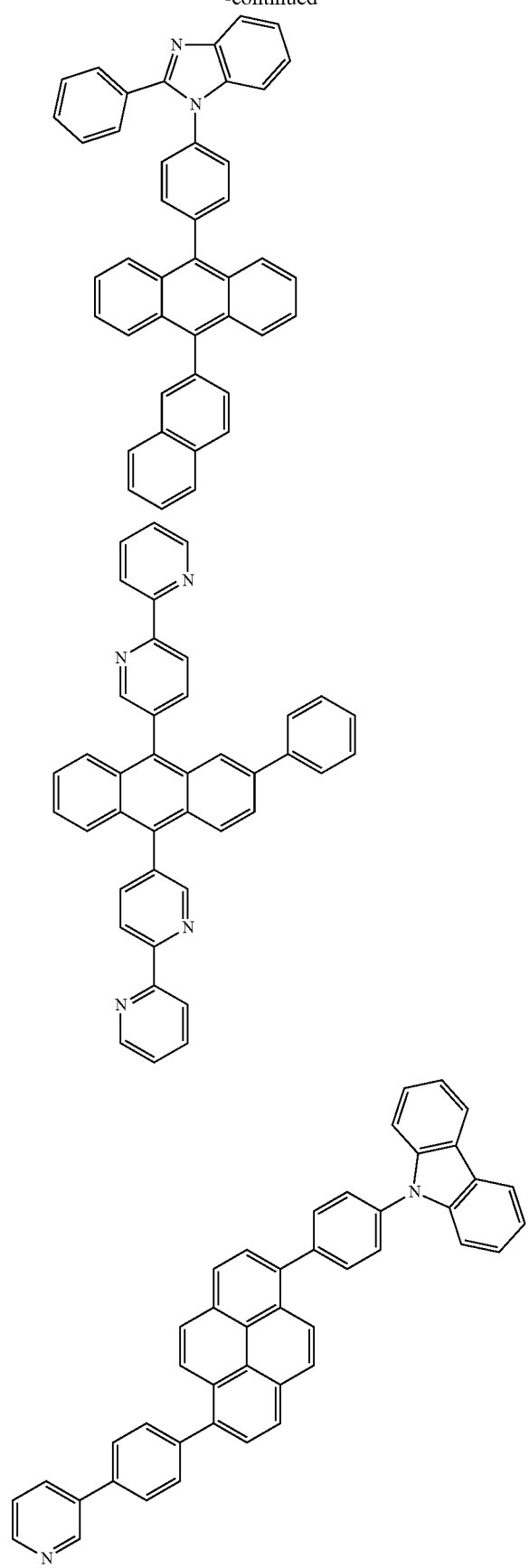
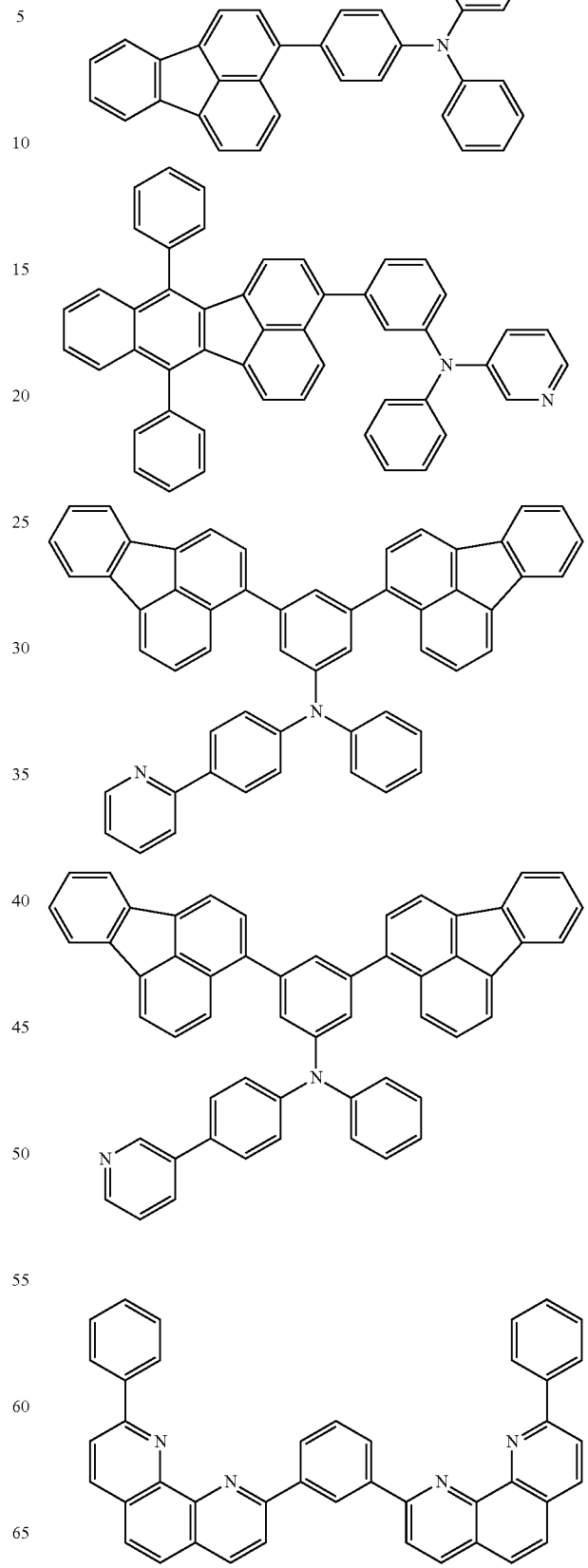

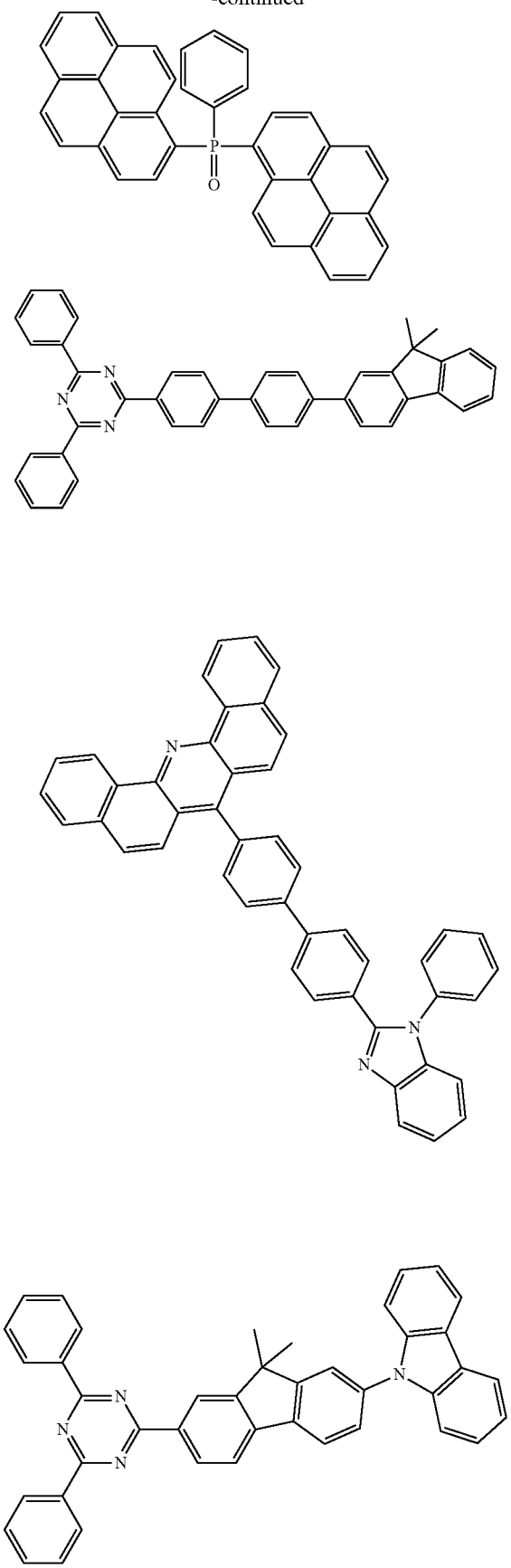
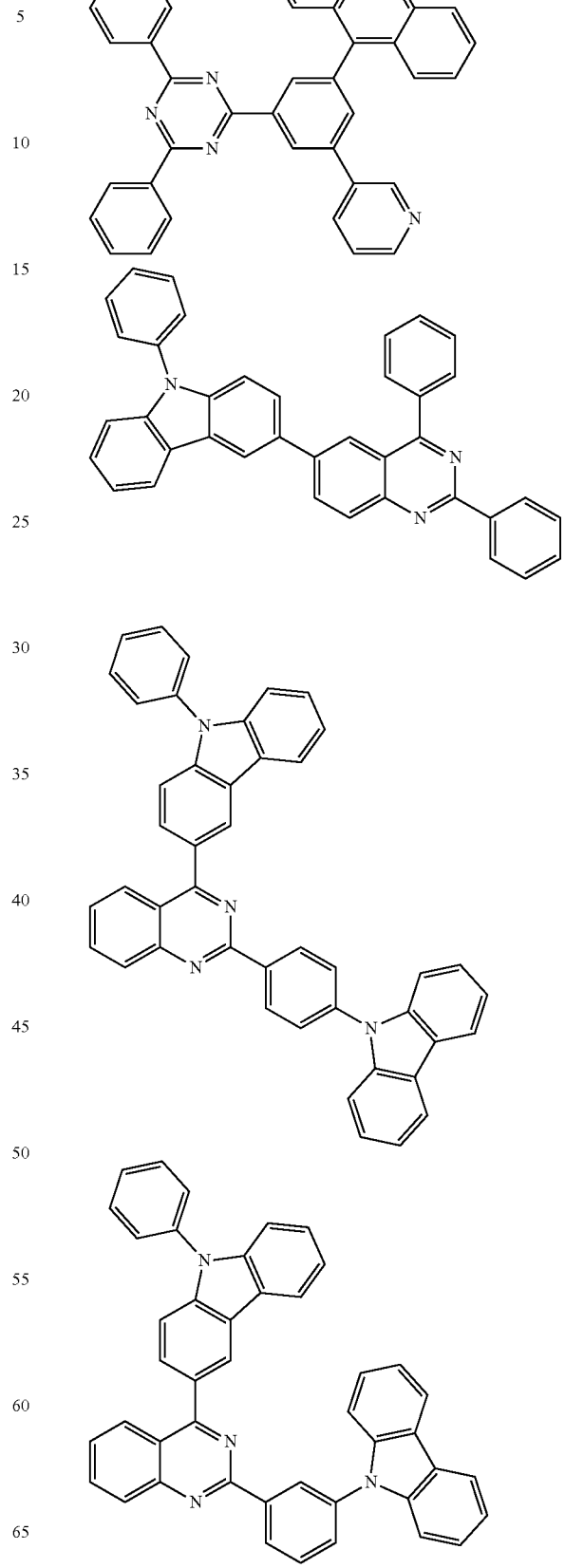

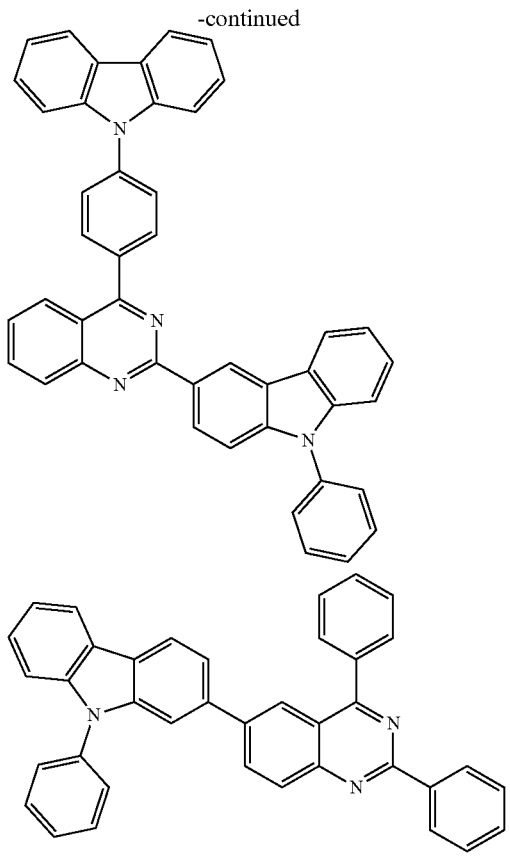

The electron transport material as described above may be used alone, or two or more of the above electron transport materials may be mixed and used, or one or more of other electron transport materials may be mixed and used with the above electron transport materials. The electron transport material may also contain a donor compound. The donor compound herein is a compound that facilitates electron injection from the cathode or from the electron injection layer to the electron transport layer by improving the electron injection barrier, and further improves the electrical conductivity of the electron transport layer.

Preferred examples of donor compounds include alkali metals, inorganic salts containing alkali metals, complexes of alkali metals and organic substances, alkaline earth metals, inorganic salts containing alkaline earth metals and complexes of alkaline earth metals, organic substances, and the like. Preferred kinds of alkali metals and alkaline earth metals include alkali metals such as lithium, sodium, potassium, rubidium and cesium, and alkaline earth metals such as magnesium, calcium, cerium and barium, all of which have a low work function and a large effect of improving electron transport ability.

These metals are preferably in a complex state with an inorganic salt or an organic substance rather than being a simple metal because of easy vapor deposition in vacuum and excellent handling property. Further, these metals are more preferably in a complex state with an organic substance because the handling in the atmosphere is facilitated and the control of the concentration to be added is easy. Examples of the inorganic salts include oxides such as LiO and $Li_2O$, nitrides, fluorides such as LiF, NaF and KF, and carbonates such as $Li_2CO_3$, $Na_2CO_3$, $K_2CO_3$, $Rb_2CO_3$ and $Cs_2CO_3$. Further, preferred examples of the alkali metals or alkaline earth metals include lithium and cesium from the viewpoint of a large low voltage driving effect to be obtained. In addition, in the complex with the organic substance, preferred examples of the organic substance include quinolinol, benzoquinolinol, pyridylphenol, flavonol, hydroxyimidazopyridine, hydroxybenzazole, hydroxytriazole and the like. Among them, a complex of an alkali metal and an organic substance is preferred from the viewpoint of increased effect of lowering the voltage of the light emitting element, and a complex of lithium and an organic substance is more preferred from the viewpoint of ease of synthesis and thermal stability. Lithium quinolinol (Liq), which can be obtained at a relatively low cost, is particularly preferred.

The ionization potential of the electron transport layer is not particularly limited, but is preferably 5.6 eV or more and 8.0 eV or less, and more preferably 5.6 eV or more and 7.0 eV or less.

The method of forming each of the above layers constituting the light emitting element is not particularly limited, and examples thereof include resistance heating vapor deposition, electron beam vapor deposition, sputtering, molecular lamination, coating and the like. Usually, resistance heating vapor deposition or electron beam vapor deposition is preferred from the viewpoint of element characteristics.

In the light emitting element of the present invention, the thickness of the organic layer depends on the resistance value of the fluorescent substance and cannot be limited, but is preferably 1 to 1000 nm. The film thicknesses of the light emitting layer, the electron transport layer, and the hole transport layer is each preferably 1 nm or more and 200 nm or less, and more preferably 5 nm or more and 100 nm or less.

The light emitting element of the present invention has a function of converting electrical energy into light. For the electrical energy herein, the direct current is mainly used, but the pulse current and alternating current can also be used. The current value and voltage value are not particularly limited, but should be selected so as to obtain the maximum brightness with the lowest possible energy in consideration of the power consumption and the life of the element.

The light emitting element of the present invention is suitably used as a display device such as a display based on a matrix and/or segment system, for example.

In the matrix method, pixels for displaying are arranged two-dimensionally in a grid pattern, a mosaic pattern, or the like, and characters and images are represented as a set of pixels. The shape and size of the pixels are determined by the application. For example, for displaying images and characters on a personal computer, monitor, or television, square pixels having a side of 300 μm or less are usually used. In the case of a large display such as a display panel, pixels having a side of the order of mm are used. In the case of a monochrome display, pixels of the same color may be arranged. In the case of a color display, red, green, and blue pixels are arranged and displayed side by side. In this case, there are typically a delta type and a stripe type. The method of driving this matrix may be either a line sequential driving method or an active matrix. Although the structure of the line sequential driving is simple, the active matrix is superior in some cases in consideration of operating characteristics. Therefore, it is necessary to use either one properly depending on the application.

The segment method in the present invention is a method in which a pattern is formed so as to display predetermined information, and a region determined by the arrangement of the pattern emits light. Examples thereof include time and temperature displays on a digital clock and a thermometer, an operating status display of an audio equipment and an electromagnetic cooker, a panel display of automobiles, and the like. The matrix display and the segment display may coexist in the same panel.

The light emitting element of the present invention is also preferably used as a backlight for various devices and the like. The backlight is mainly used for the purpose of improving the visibility of a display device that does not emit light by itself such as a display, and is used in display devices such as liquid crystal displays, clocks, audio devices, automobile panels, display boards and signs. In particular, the light emitting element of the present invention is preferably used for a liquid crystal display, particularly for a backlight for personal computers which have been attempted to be thinner, and can provide a backlight which is thinner and lighter than the conventional one.

The light emitting element according to an embodiment of the present invention is also preferably used as various lighting devices. The light emitting element according to an embodiment of the present invention can achieve both high efficiency emission and high color purity, and can provide thinner and lighter devices. Therefore, a lighting device with a low power consumption, bright emission colors and an excellent design can be realized.

Color Conversion Composition

The color conversion composition according to an embodiment of the present invention will be described in detail. The color conversion composition according to an embodiment of the present invention converts incident light coming from a light emitting body such as a light source into light having a wavelength longer than the incident light, and preferably contains is a pyrromethene-boron complex according to the present invention described above and a binder resin.

The color conversion composition according to an embodiment of the present invention may appropriately contain other compounds if necessary, in addition to the pyrromethene-boron complex according to the present invention. For example, an assist dopant such as rubrene may be contained in order to further increase the efficiency of energy transfer from the excitation light to the pyrromethene-boron complex according to the present invention. Further, when it is desired to add an emission color other than the emission color of the pyrromethene-boron complex according to the present invention, a desired organic fluorescent material, for example, an organic fluorescent material such as a coumarin derivative or a rhodamine derivative can be added. In addition to the organic fluorescent material, a combination of known fluorescent materials such as an inorganic fluorescent substance, a fluorescent pigment, a fluorescent dye, and quantum dots can be added.

Examples of the organic fluorescent materials other than the pyrromethene-boron complex of the present invention will be shown below, but the present invention is not particularly limited thereto.

[Chem 13]

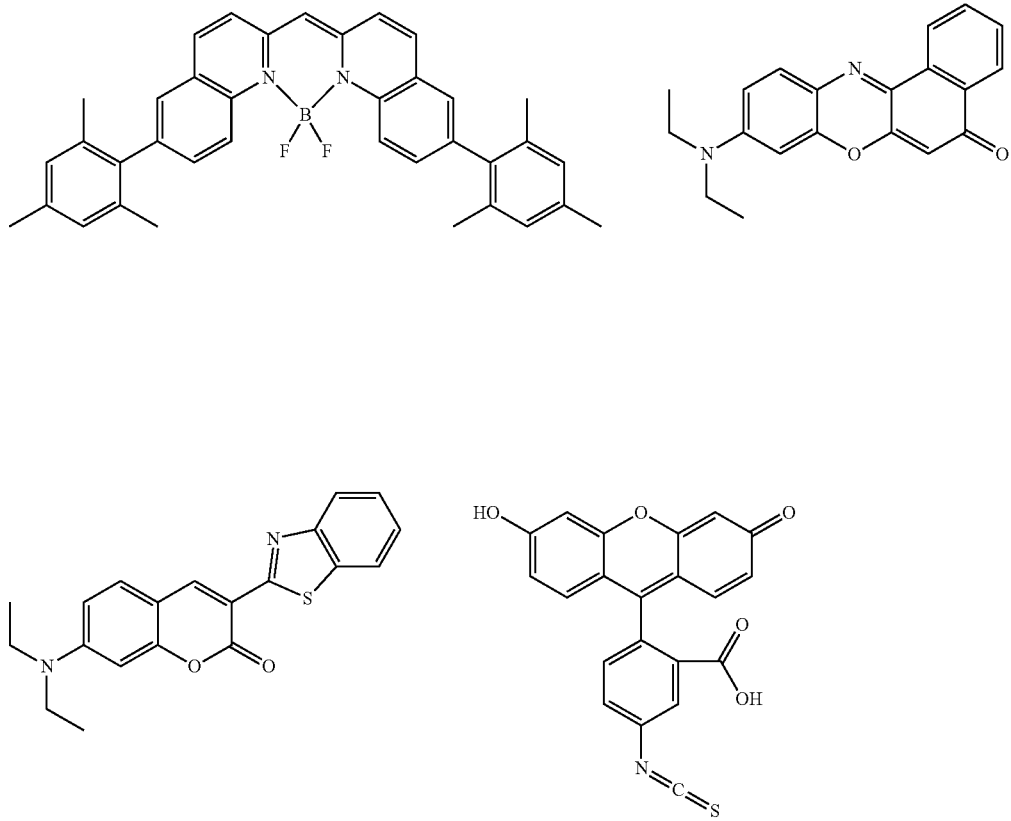

-continued
47 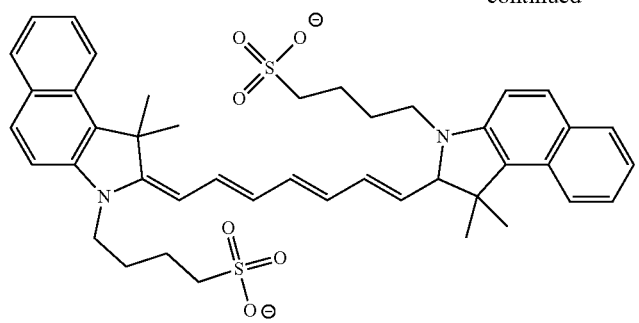
48 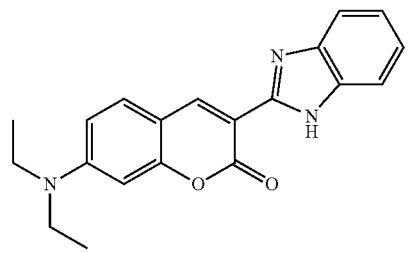
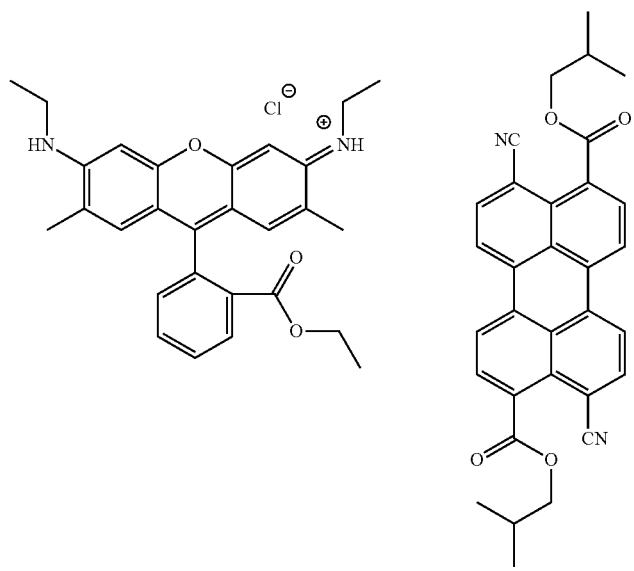
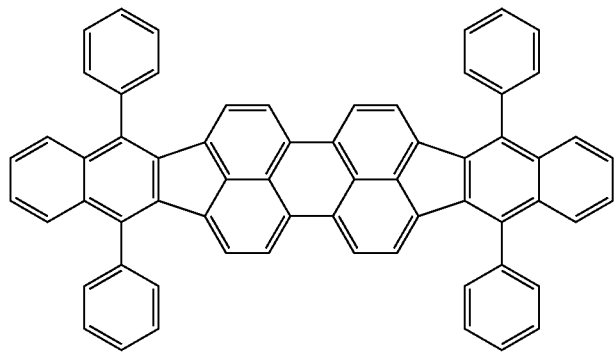
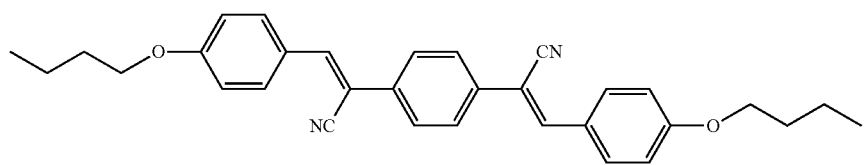

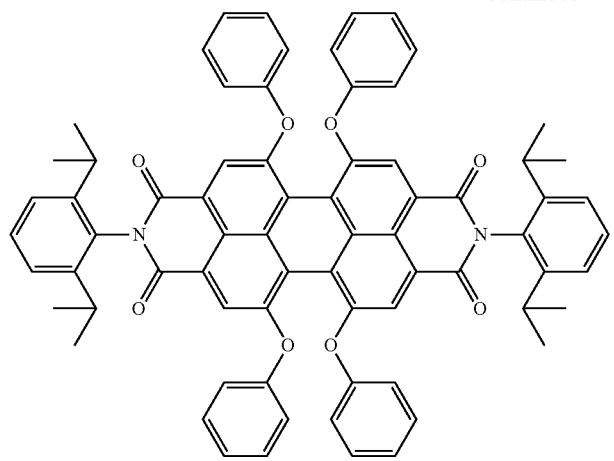
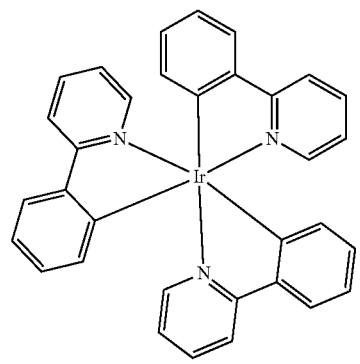
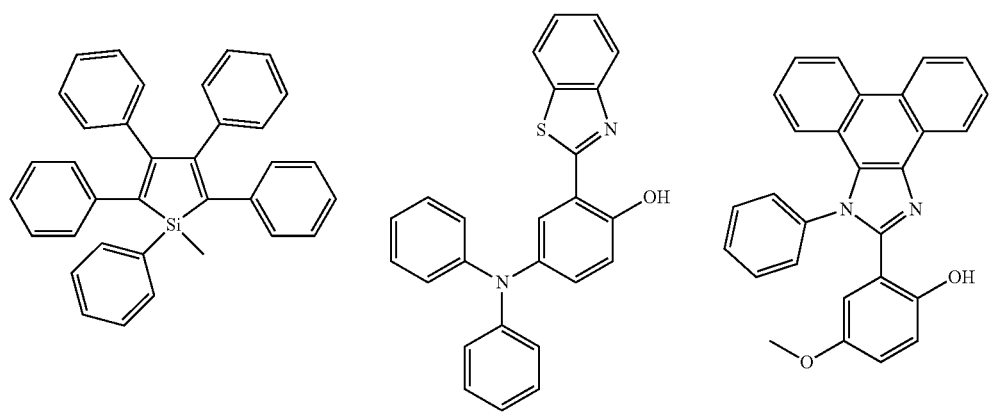
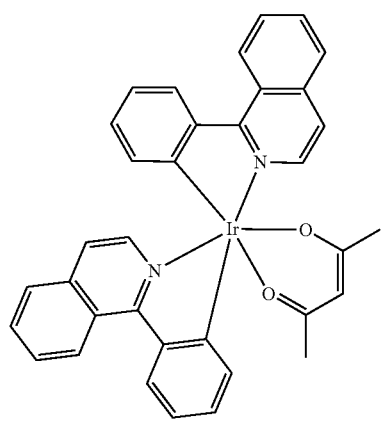
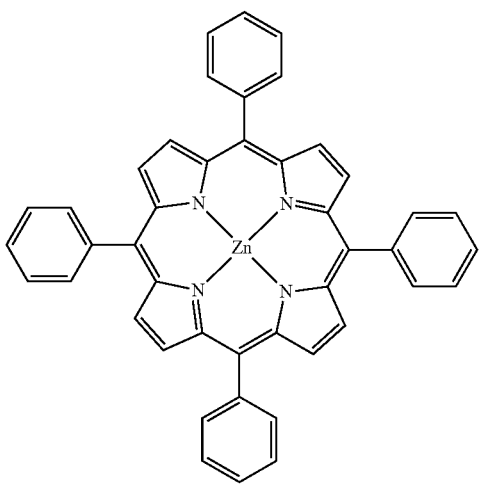

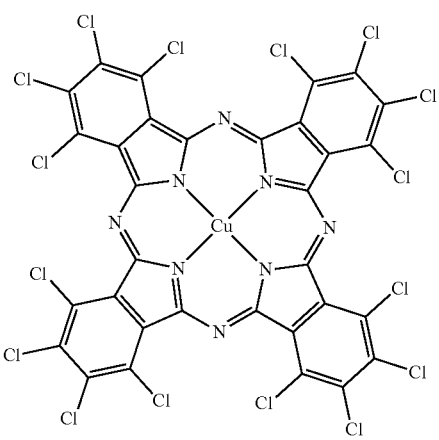

In the present invention, the color conversion composition preferably emits light observed in a region having a peak wavelength of 500 nm or more and less than 580 nm when excitation light is used. Further, the color conversion composition preferably emits light observed in a region having a peak wavelength of 580 nm or more and 750 nm or less when excitation light is used.

That is, the color conversion composition according to an embodiment of the present invention preferably contains the following fluorescent material (a) and fluorescent material (b). The fluorescent material (a) is a fluorescent material that emits light observed in a region having a peak wavelength of 500 nm or more and less than 580 nm when excitation light is used. The fluorescent material (b) is a fluorescent material that emits light observed in a region having a peak wavelength of 580 nm or more and 750 nm or less when excited by at least one of excitation light and emission from the fluorescent material (a). At least one of these fluorescent material (a) and fluorescent material (b) is preferably the pyrromethene-boron complex of the present invention. Further, as the excitation light mentioned above, excitation light having a wavelength in the range of 430 nm or more and 500 nm or less is preferably used.

A part of the excitation light having a wavelength in the range of 430 nm or more and 500 nm or less transmits partially through the color conversion film according to an embodiment of the present invention. Therefore, when a blue LED having a sharp emission peak is used, each of blue, green, and red colors shows a sharp emission spectrum and, white light with good color purity can be obtained. As a result, it is possible to efficiently create a larger color gamut with more vivid colors, especially in a display. Further, in lighting applications, as compared with the current mainstream white LED, which is a combination of a blue LED and a yellow phosphor, the emission characteristics in the green region and the red region are particularly improved. Thus, a preferred white light source with improved color-rendering property can be obtained.

As the fluorescent material (a) and the fluorescent material (b), known materials can be used. Pyrromethene derivatives are particularly suitable compounds because the pyrromethene derivatives give a high emission quantum yield and emits light of high color purity. Among the pyrromethene derivatives, the pyrromethene-boron complex of the present invention is preferred because the durability is significantly improved.

Further, both the fluorescent material (a) and the fluorescent material (b) are preferably the pyrromethene-boron complexes of the present invention because it is possible to achieve the high efficiency emission and the high color purity as well as the high durability.

The content of the pyrromethene-boron complex represented by the general formula (1) in the color conversion composition according to an embodiment of the present invention depends on the molar extinction coefficient of the pyrromethene-boron complex, the emission quantum yield and the absorption intensity at the excitation wavelength, as well as on the thickness and transmittance of the film to be produced, but is usually $1.0 \times 10^{-4}$ parts by mass to 30 parts by mass with respect to 100 parts by mass of the binder resin. The content of this compound is more preferably $1.0 \times 10^{-3}$ parts by mass to 10 parts by mass, and particularly preferably $1.0 \times 10^{-2}$ parts by mass to 5 parts by mass with respect to 100 parts by mass of the binder resin.

Binder Resin

The binder resin forms a continuous phase and may be any material that is excellent in moldability, transparency, heat resistance, and the like. Examples of the binder resin include known resins such as photocurable resist materials having a reactive vinyl group such as acrylic acid resins, methacrylic acid resins, polyvinyl cinnamate resins, cyclo-rubber resins, epoxy resins, silicone resins (including organopolysiloxane cured products (crosslinked products) such as silicone rubber and silicone gel), urea resins, fluorine resins, polycarbonate resins, acrylic resins, urethane resins, melamine resins, polyvinyl resins, polyamide resins, phenol resins, polyvinyl alcohol resins, cellulose resins, aliphatic ester resins, aromatic ester resins, aliphatic polyolefin resins, and aromatic polyolefin resins. As the binder resin, copolymer resins of these may be used. By appropriately designing these resins, a binder resin useful for the color conversion composition and the color conversion film according to an embodiment of the present invention can be obtained. Among these resins, a thermoplastic resin is more preferred because the process of film formation is easy. Among the thermoplastic resins, silicone resins, acrylic resins, ester resins, olefin resins or mixtures thereof can be suitably used from the viewpoint of transparency, heat resistance and the like. Further, particularly preferred thermoplastic resins from the viewpoint of durability are acrylic resins, ester resins, and cycloolefin resins.

Other Components

The color conversion composition according to an embodiment of the present invention may contain another component such as a light stabilizer, an antioxidant, a processing and heat stabilizer, and a light resistant stabilizer such as an ultraviolet absorber, silicone microparticles, a silane coupling agent or the like, in addition to the pyrromethene-boron complex of the present invention and the binder resin as described above.

Solvent

The color conversion composition according to an embodiment of the present invention may contain a solvent. The solvent is not particularly limited as long as it can adjust the viscosity of the resin in a fluid state and does not excessively affect the emission and durability of the fluorescent substance. Examples of such a solvent include toluene, methyl ethyl ketone, methyl isobutyl ketone, hexane, acetone, terpineol, texanol, methyl cellosolve, butyl carbitol, butyl carbitol acetate, propylene glycol monomethyl ether acetate and the like. A mixture of two or more of these solvents can be also used. Among these solvents, toluene is particularly suitably used because toluene does not affect the deterioration of the pyrromethene-boron complex of the present invention and a small amount of residual solvent remains after drying.

Method of Producing a Color Conversion Composition

An example of a method of producing a color conversion composition according to an embodiment of the present invention will be described below. In this production method, a predetermined amount of the pyrromethene-boron complex of the present invention, a binder resin, a solvent and the like are mixed. After the above components are mixed to achieve a predetermined composition, the resulting mixture is uniformly mixed and dispersed by a stirrer/kneader such as a homogenizer, a self-revolving stirrer, a three roll mill, a ball mill, a planetary ball mill, and a bead mill, to obtain a color conversion composition. After mixture and dispersion, or during the process of mixture and dispersion, defoaming is also preferably performed under vacuum or reduced pressure conditions. In addition, a specific component may be mixed in advance, or a treatment such as aging may be performed. It is also possible to remove the solvent with an evaporator to achieve the desired solid content concentration.

Method of Producing a Color Conversion Film

The color conversion film according to an embodiment of the present invention includes the above-mentioned color conversion composition or a color conversion layer made of a cured product thereof. In the present invention, the structure of the color conversion film is not limited as long as the film contains the color conversion composition or the color conversion layer made of a cured product obtained by curing the color conversion composition. The cured product of the color conversion composition is preferably contained in the color conversion film as a color conversion layer obtained by curing the color conversion composition (color conversion layer made of the cured product of the color conversion composition). Representative examples of the structure of the color conversion film are the following four structures.

FIG. 1 is a schematic cross-sectional view of a first example of a color conversion film according to an embodiment of the present invention. As shown in FIG. 1, the color conversion film 1A of the first example is a single-layer film constituted by a color conversion layer 11. The color conversion layer 11 is a layer made of a cured product of the above-mentioned color conversion composition.

Figure 2:
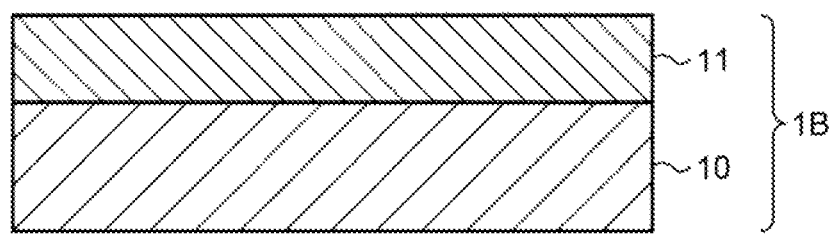
FIG. 2 is a schematic cross-sectional view of a second example of a color conversion film according to an embodiment of the present invention.

FIG. 2 is a schematic cross-sectional view of a second example of a color conversion film according to an embodiment of the present invention. As shown in FIG. 2, the color conversion film 1B of the second example is a laminate of a substrate layer 10 and a color conversion layer 11. In the structural example of the color conversion film 1B, the color conversion layer 11 is laminated on the substrate layer 10.

Figure 3:
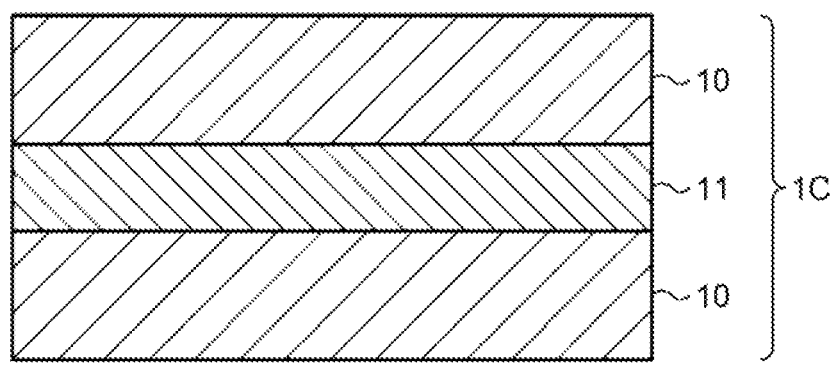
FIG. 3 is a schematic cross-sectional view of a third example of a color conversion film according to an embodiment of the present invention.

FIG. 3 is a schematic cross-sectional view of a third example of a color conversion film according to an embodiment of the present invention. As shown in FIG. 3, the color conversion film 1C of the third example is a laminate of a plurality of substrate layers 10 and a color conversion layer 11. In this structural example of the color conversion film 1C, the color conversion layer 11 is sandwiched by the plurality of substrate layers 10.

Figure 4:
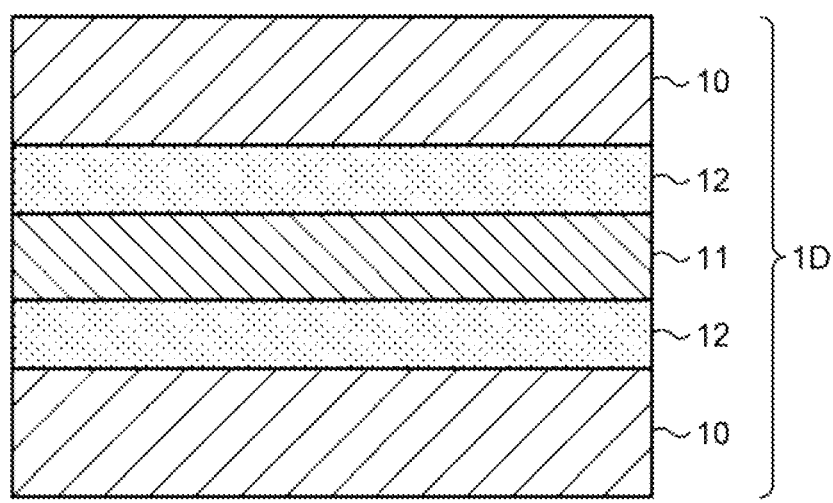
FIG. 4 is a schematic cross-sectional view of a fourth example of a color conversion film according to an embodiment of the present invention.

FIG. 4 is a schematic cross-sectional view of a fourth example of a color conversion film according to an embodiment of the present invention. As shown in FIG. 4, the color conversion film 1D of the fourth example is a laminate of a plurality of substrate layers 10, a color conversion layer 11, and a plurality of barrier films 12. In this structural example of the color conversion film 1D, the color conversion layer 11 is sandwiched by the plurality of barrier films 12, and the laminate of the color conversion layer 11 and the plurality of barrier films 12 is sandwiched by the plurality of substrate layers 10. That is, the color conversion film 1D may have barrier films 12 as shown in FIG. 4 in order to prevent deterioration of the color conversion layer 11 due to oxygen, water and heat.

Substrate Layer

The substrate layer (for example, the substrate layer 10 shown in FIGS. 2 to 4) is not particularly limited, and known metals, films, glass, ceramics, paper and the like can be used. Among these, glass and resin films are preferably used because of the easy production of the color conversion film and the easy molding of the color conversion film. Further, a film with a high strength is preferred so that there is no risk of breakage or the like when the film-shaped substrate layer is handled. Resin films are preferred from the viewpoint of their required characteristics and from the economical viewpoint. Among them, plastic films selected from the group consisting of PET, polyphenylene sulfide, polycarbonate, and polypropylene are preferred from the economical and handling viewpoint. When the color conversion film is dried or when the color conversion film is pressure-molded at a high temperature of 200° C. or higher by an extruder, a polyimide film is preferred from the viewpoint of heat resistance. The surface of the substrate layer may be treated with a mold release agent in advance so that the film is easily peeled.

The thickness of the substrate layer is not particularly limited, but the lower limit is preferably 25 μm or more, and more preferably 38 μm or more. The upper limit is preferably 5000 μm or less, more preferably 3000 μm or less.

Color Conversion Layer

An example of a method of producing a color conversion layer of the color conversion film according to an embodiment of the present invention will be described below. In this method of producing a color conversion layer, the color conversion composition produced by the method as described above is applied on the base such as a substrate layer or a barrier film, and then dried. In this way, a color conversion layer (for example, the color conversion layer 11 shown in FIGS. 1 to 4) is formed. The coating can be performed by a known method, but in order to obtain the film thickness uniformity of the color conversion layer, coating with a slit die coater is preferred.

The color conversion layer can be dried by using a general heating device such as a hot air dryer or an infrared dryer. To heat the color conversion film, a general heating device such as a hot air dryer or an infrared dryer is used. In this case, the heating conditions are usually 40° C. to 250° C. for 1 minute to 5 hours, preferably 60° C. to 200° C. for 2 minutes to 4 hours. It is also possible to thermally cure in stages such as step-curing.

After the color conversion layer is produced, it is also possible to change the substrate layer as needed. In this case, examples of a simple method include a method of exchange using a hot plate, a method using a vacuum laminator or a dry film laminator, and the like, but the method is not limited thereto.

The thickness of the color conversion layer is not particularly limited, but is preferably 10 µm to 1000 µm. In cases where the thickness of the color conversion layer is smaller than 10 µm, a problem of smaller toughness of the color conversion film occurs. In cases where the thickness of the color conversion layer exceeds 1000 µm, cracks are likely to occur, resulting in difficult formation of a color conversion film. The thickness of the color conversion layer is more preferably 30 µm to 100 µm.

On the other hand, from the viewpoint of increasing the heat resistance of the color conversion film, the film thickness of the color conversion film is preferably 200 µm or less, more preferably 100 µm or less, and further preferably 50 µm or less.

The film thickness of the color conversion film of the present invention refers to the film thickness (average film thickness) measured according to the method of measuring thickness by mechanical scanning (A) in JIS K7130-1999 Plastics—Film and sheeting—Determination of thickness.

Barrier Film

The barrier film (for example, the barrier film 12 shown in FIG. 4) is appropriately used, for example, when the gas barrier property is improved with respect to the color conversion layer. Examples of the barrier film include films made of inorganic oxides such as silicon oxide, aluminum oxide, titanium oxide, tantalum oxide, zinc oxide, tin oxide, indium oxide, yttrium oxide, and magnesium oxide, inorganic nitrides such as silicon nitride, aluminum nitride, titanium nitride, and silicon carbonitride, mixtures thereof, and metal oxide thin films and metal nitride thin films obtained by adding other elements to these, and various resins such as polyvinylidene chloride, acrylic resins, silicon resins, melamine resins, urethane resins, fluorine resins, and polyvinyl alcohol resins such as saponified vinyl acetate. Examples of the barrier film having a barrier function against moisture include films made of various resins such as polyethylene, polypropylene, nylon, polyvinylidene chloride, a copolymer of vinylidene chloride and vinyl chloride, a copolymer of vinylidene chloride and acrylonitrile, a fluorine resin, and a polyvinyl alcohol resin such as a saponified vinyl acetate.

The barrier film may be provided on both sides of the color conversion layer 11 like the barrier films 12 illustrated in FIG. 4, or may be provided on only one side of the color conversion layer 11. In addition, depending on the required functions of the color conversion film, an auxiliary layer having an anti-reflection function, an anti-glare function, an anti-reflection and anti-glare function, a hard coat function (friction resistance function), an anti-static function, an anti-fouling function, an electromagnetic wave shielding function, an infrared ray-cut function, an ultraviolet ray-cut function, a polarization function, and a toning function may be further provided.

(Color Conversion Substrate)

The color conversion substrate according to an embodiment of the present invention has a structure containing at least the color conversion layer comprising the pyrromethene-boron complex of the present invention described above. The color conversion substrate contains a plurality of color conversion layers on a transparent substrate. The color conversion layer is a layer made of the color conversion composition according to an embodiment of the present invention or a cured product thereof. The color conversion layer preferably contains a red conversion layer and a green conversion layer. The red conversion layer is made of a phosphor material that absorbs at least blue light and emits red light. The green conversion layer is made of a phosphor material that absorbs at least blue light and emits green light. Further, a partition wall may be formed, and the color conversion layer is preferably arranged between the partition walls (recessed portion). The excitation light may be incident from the transparent substrate side and visually recognized from the opposite side of the transparent substrate, or the excitation light may be incident from the color conversion layer side and visually recognized from the transparent substrate side. The quantum yield of the color conversion layer is usually 0.5 or more, preferably 0.7 or more, more preferably 0.8 or more, and still more preferably, 0.9 or more when the color conversion substrate is irradiated with blue light having a peak wavelength of 440 or more and 460 nm or less.

(Excitation Light)

Any kind of excitation light can be used as long as the excitation light emits light in a wavelength region that can be absorbed by a fluorescent substance such as the pyrromethene-boron complex of the present invention. Examples thereof include fluorescent light sources such as hot cathode tubes, cold cathode tubes, and inorganic electroluminescence (EL), organic EL element light sources, LED light sources, incandescent light sources, sunlight, and the like. In principle, any of these excitation light can be used. In particular, light from an LED light source is suitable excitation light. In display and lighting applications, light from a blue LED light source having excitation light in a wavelength range of 430 nm or more and 500 nm or less is more suitable excitation light because the color purity of the blue light can be enhanced.

The excitation light may have one kind of emission peak or may have two or more kinds of emission peaks, but in order to increase the color purity, the excitation light having one kind of emission peak is preferred. It is also possible to use a plurality of excitation light sources having different kinds of emission peaks in an arbitrary combination.

Light Source Unit

The light source unit according to an embodiment of the present invention has a structure containing at least a light source and the color conversion film or color conversion substrate as described above. The method of arranging the light source and the color conversion film or the color conversion substrate is not particularly limited. A structure in which the light source is in close contact with the color conversion film or the color conversion substrate may be used, or the remote phosphor system in which the light source and the color conversion film or the color conversion substrate are separated from each other may be used. In addition, the light source unit may be further provided with a color filter for the purpose of increasing the color purity.

As described above, the excitation light in the wavelength range of 430 nm or more and 500 nm or less has a relatively small excitation energy, and thus the decomposition of a fluorescent substance such as the pyrromethene-boron complex of the present invention can be prevented. Therefore, the light source used in the light source unit is preferably a light emitting diode having maximum emission in the wavelength range of 430 nm or more and 500 nm or less. Further, this light source preferably has maximum emission in a wavelength range of 440 nm or more and 470 nm or less.

Display, Lighting Device

The display according to an embodiment of the present invention contains the color conversion film or color conversion substrate as described above. For example, in a display such as a liquid crystal display, a light source unit having the above-mentioned light source, color conversion film, color conversion substrate, or the like is used as a backlight unit. The lighting device according to an embodiment of the present invention contains the color conversion film or color conversion substrate as described above. For example, this lighting device has a structure in which a blue LED light source as a light source unit and a color conversion film or a color conversion substrate that converts the blue light from the blue LED light source into light having a longer wavelength are combined to emit white light.

EXAMPLES

The present invention is explained below by way of Examples, but the present invention is not limited to these Examples.

Synthesis Example 1

Method for Synthesizing a Compound RD-A1

A mixed solution of 2.00 g of 2,4-bis(4-t-butylphenyl) pyrrole, 1.08 g of 2-methoxybenzoyl chloride and 30 ml of o-xylene was stirred with heating for 6 hours under a nitrogen gas stream. After the solution was cooled to room temperature, methanol was added, and the precipitated solid was filtered and vacuum dried to obtain 2.53 g of 2-(2-methoxybenzoyl)-3,5-bis(4-t-butylphenyl)pyrrole.

Then, a mixed solution of 2.53 g of 2-(2-methoxybenzoyl)-3,5-bis(4-t-butylphenyl)pyrrole, 0.98 g of spirofluorene indenopyrrole, 1.12 g of methanesulfonic anhydride, and 32 ml of degassed toluene was heated at 125° C. for 7 hours under a nitrogen gas stream. After the solution was cooled to room temperature, 32 ml of water was added, followed by extraction with 32 ml of toluene. The organic layer was washed twice with 20 ml of water, magnesium sulfate was added to the organic layer, and the mixture was filtered. The solvent was removed from the filtrate using an evaporator to obtain a residual pyrromethene body.

Then, to a mixed solution of the obtained pyrromethene body and 32 ml of toluene, 1.64 ml of diisopropylethylamine and 2.42 ml of a boron trifluoride diethyl ether complex were added under a nitrogen gas stream, and the resulting mixture was stirred at 80° C. for 1 hour. Subsequently, 32 ml of water was added, followed by extraction with 32 ml of dichloromethane. The organic layer was washed twice with 20 ml of water, dried over magnesium sulfate, and then the solvent was removed using an evaporator. The residue was purified by silica gel column chromatography and dried under vacuum to obtain 1.55 g of a magenta powder. The result of $^1$H-NMR analysis of the obtained powder was as follows, and the magenta powder obtained above was confirmed to be the compound RD-A1. Spirofluorene indenopyrrole was synthesized according to the known methods described in Org. Lett., vol. 12, pp. 296 (2010) and the like.

Compound RD-A1: $^1$H-NMR (CDCl$_3$ (d=ppm)) δ 1.21 (s, 9H), 1.43 (s, 9H), 3.39 (s, 3H), 5.97 (s, 1H), 6.13 (d, 1H), 6.51 (s, 1H), 6.56 (d, 1H), 6.63 (t, 1H), 6.79 (d, 2H), 6.88-6.96 (m, 5H), 7.04 (dd, 1H), 7.09-7.19 (m, 3H), 7.29-7.40 (m, 3H), 7.56 (d, 2H), 7.75 (t, 2H), 8.02 (d, 2H), 8.30 (d, 1H).

The compound RD-A1 was subjected to purification by sublimation at about 260° C. under a pressure of $1 \times 10^{-3}$ Pa using an oil diffusion pump, and then used as a light emitting element material.

Furthermore, the compound RD-A1 exhibited the following photophysical properties.

Absorption spectrum (solvent: toluene): λmax 610 nm

Fluorescence spectrum (solvent: toluene): λmax 632 nm, full width at half maximum 37 nm.

[Chem 14]

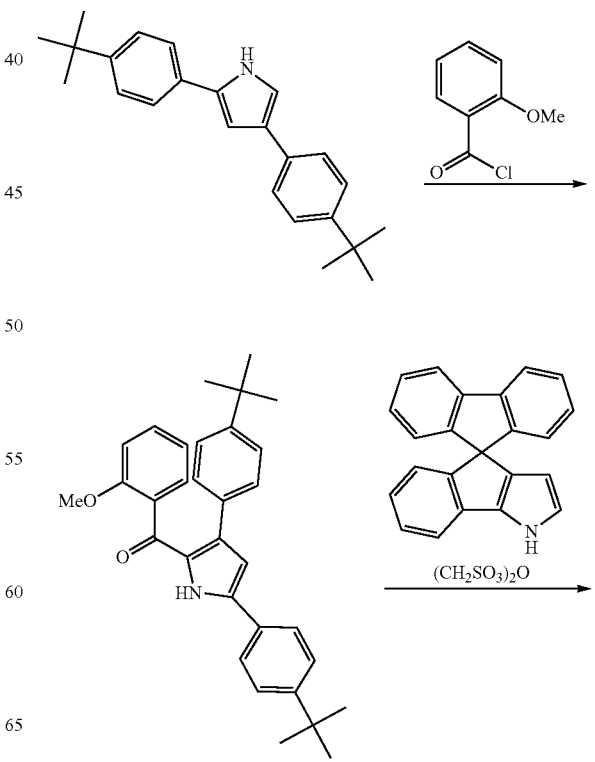

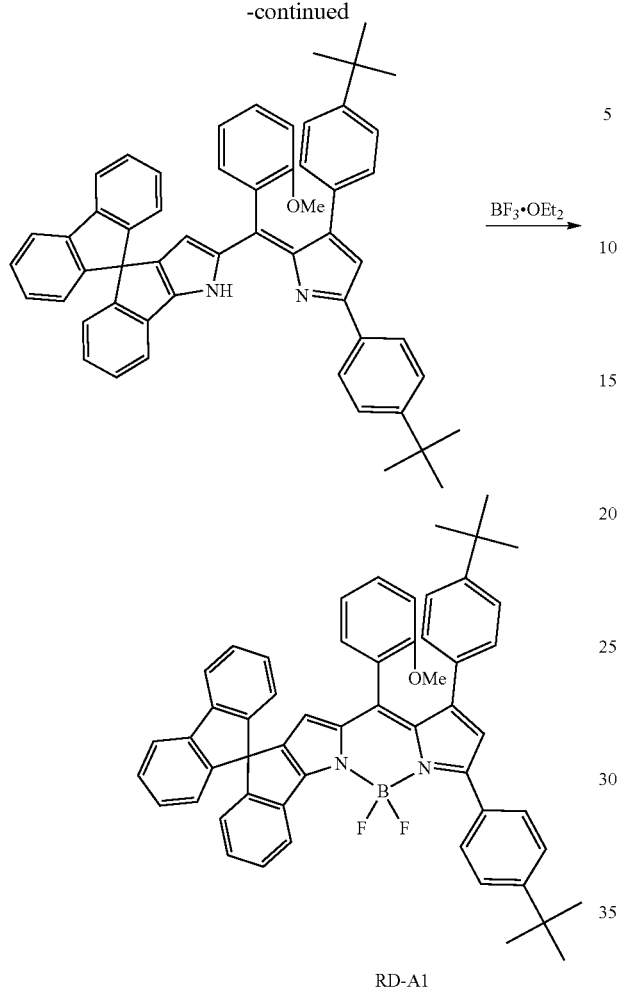

RD-A1

Method for Synthesizing a Compound RD-B1

A mixed solution of 99 mg of 2-methoxybenzaldehyde, 272 mg of dimethyl indenopyrrole and 15 ml of dichloromethane was stirred at room temperature under a nitrogen gas stream. After 2 drops of trifluoroacetic acid was added, the mixture was stirred at room temperature for 1 hour. To this mixture, 247 mg of 2,3-dichloro-5,6-diamino-p-benzoquinone (DDQ) was added, and furthermore, 517 µl of N,N-diisopropylethylamine and 364 µl of a boron trifluoride diethyl ether complex were added, and the resulting mixture was stirred at room temperature for 8 hours. Then, water was added and the mixture was extracted with 50 ml of dichloromethane. The organic layer was washed twice with 30 ml of water, dried over sodium sulfate, and then the solvent was removed using an evaporator. The residue was purified by silica gel column chromatography and dried under vacuum to obtain 0.18 g of a magenta powder. The result of $^1$H-NMR analysis of the obtained powder was as follows, and the magenta powder obtained above was confirmed to be the compound RD-B1. Dimethyl indenopyrrole was synthesized according to the known methods described in Org. Lett., vol. 12, pp. 296 (2010) and the like.

Compound RD-B1: $^1$H-NMR (CDCl$_3$ (d=ppm)) δ 1.44 (d, 12H), 3.77 (s, 3H), 6.34 (s, 2H), 6.98-7.10 (m, 2H), 7.35-7.44 (m, 7H), 7.48 (t, 1H), 8.28 (d, 2H).

Furthermore, the compound RD-B1 exhibited the following photophysical properties.

Absorption spectrum (solvent: toluene): λmax 633 nm

Fluorescence spectrum (solvent: toluene): λmax 642 nm, full width at half maximum 24 nm.

[Chem 15]

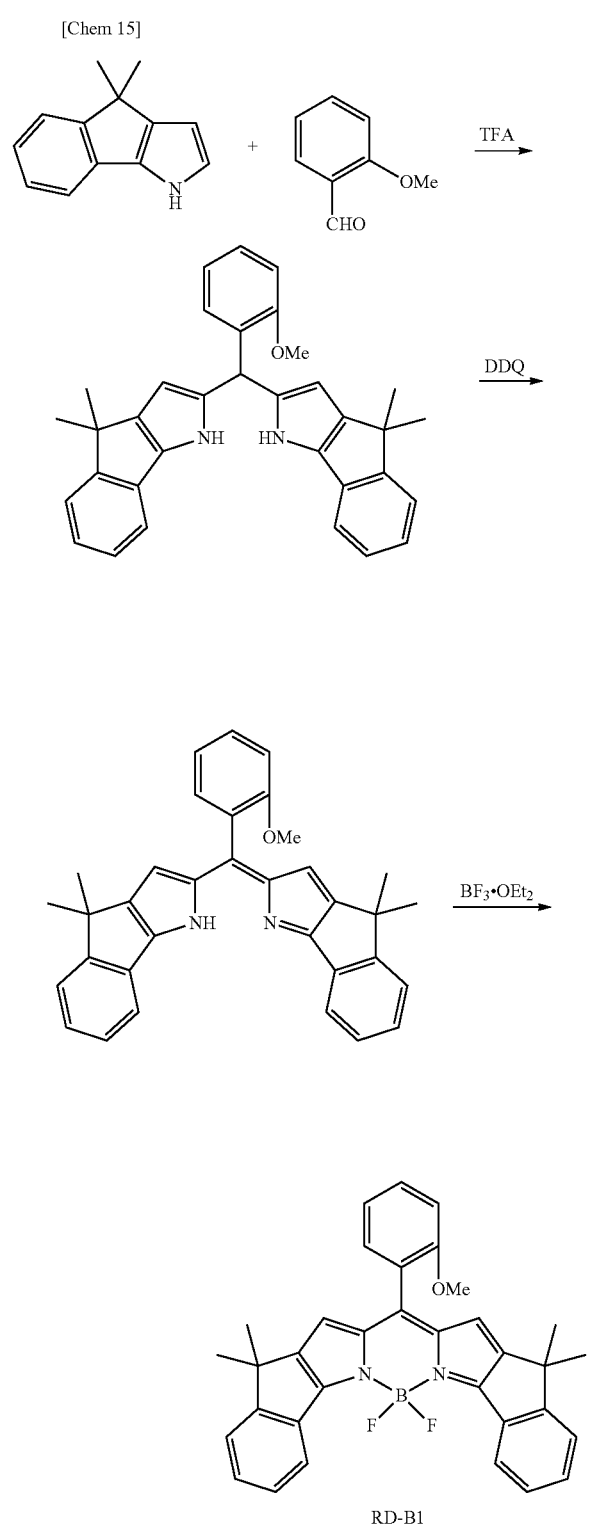

RD-B1

Light Emitting Element
The compounds in the following Examples and Comparative Examples are the compounds shown below.
[Chem 16]
RD-A1
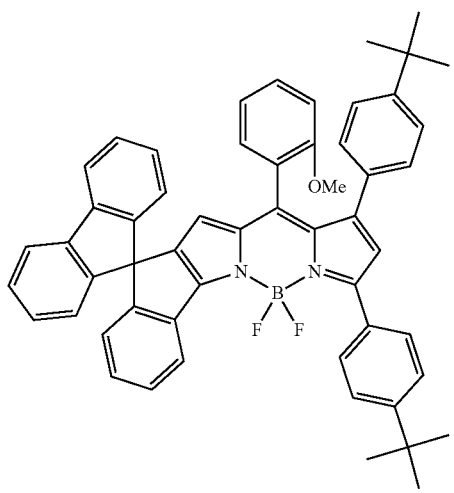
RD-A2
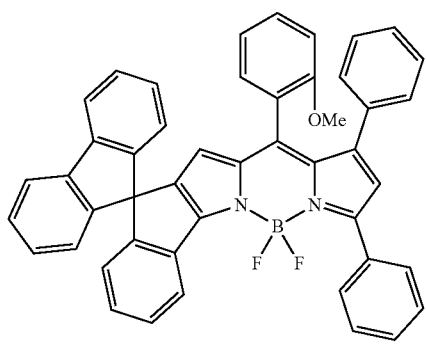
RD-A3
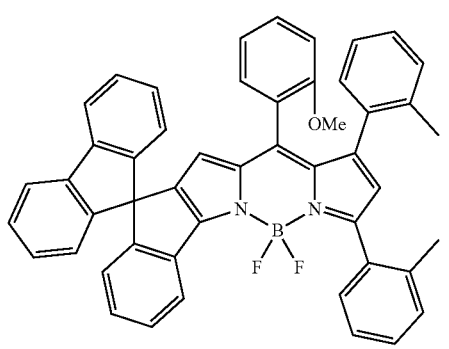
RD-A4
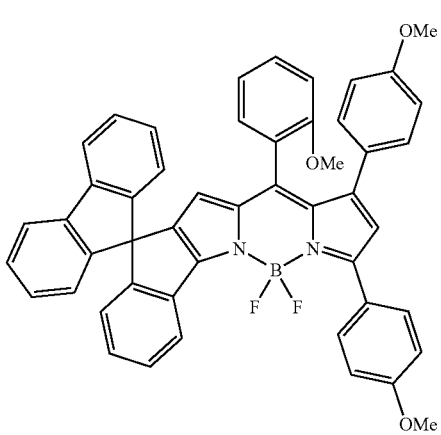
RD-A5
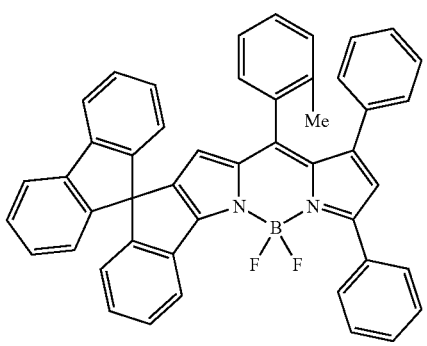
RD-A6
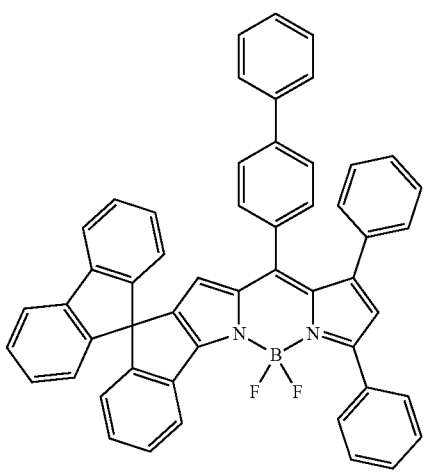
RD-A7
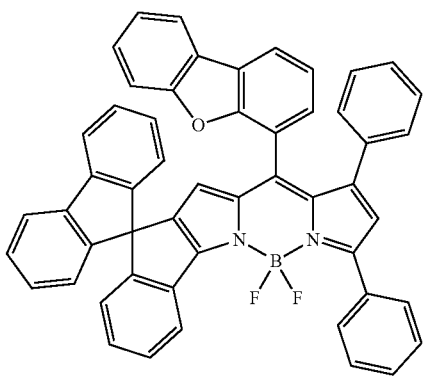

RD-A8
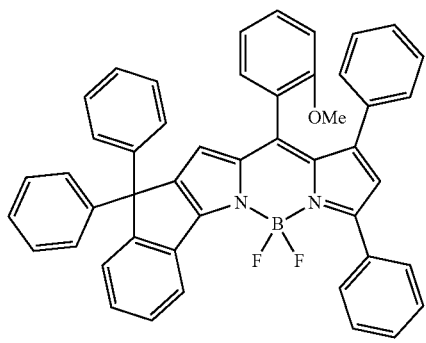
RD-A9
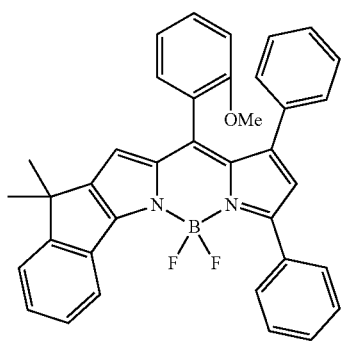
[Chem 17]
RD-A10
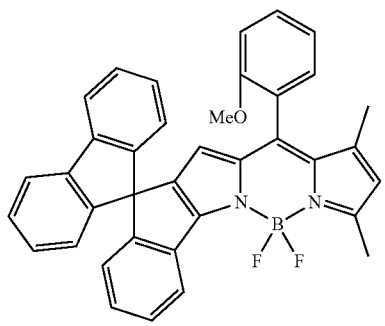
R-A1
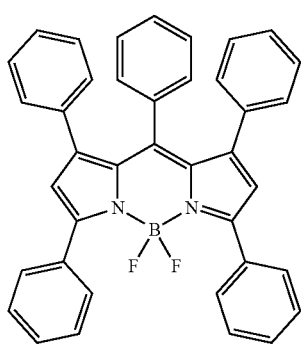
R-A2
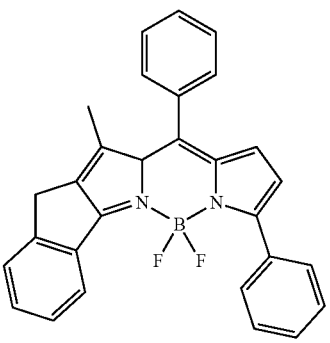
[Chem 18]
RD-B1
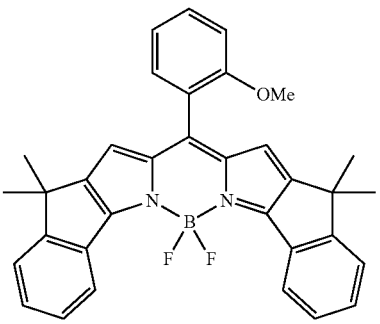
RD-B2
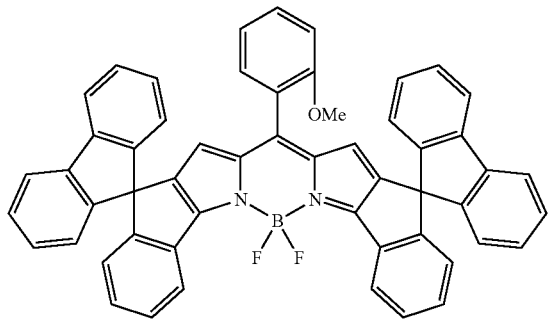
RD-B3
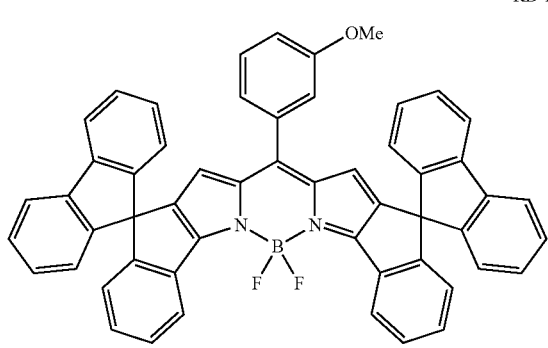

RD-B4

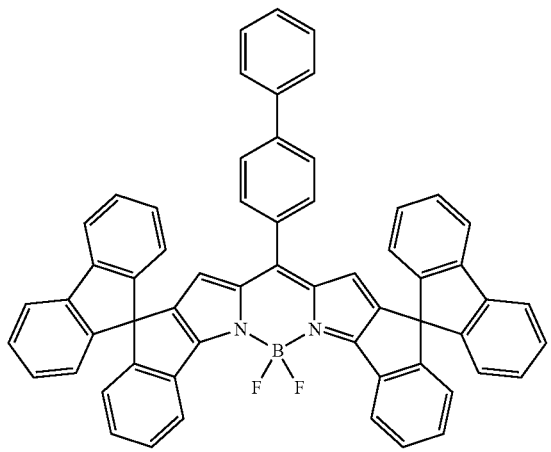

RD-B5

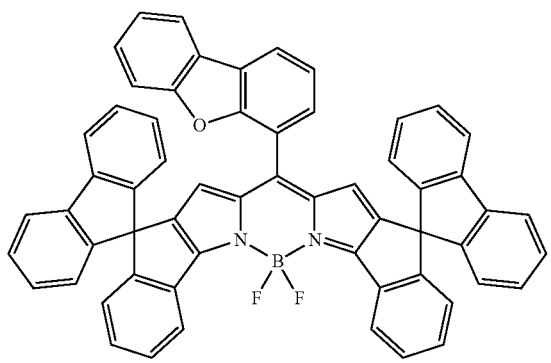

R-B1

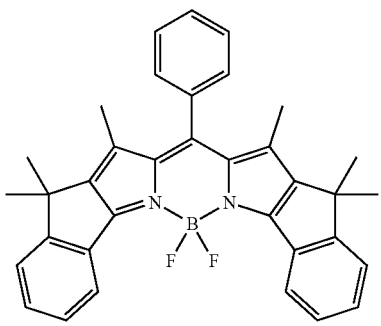

R-B2

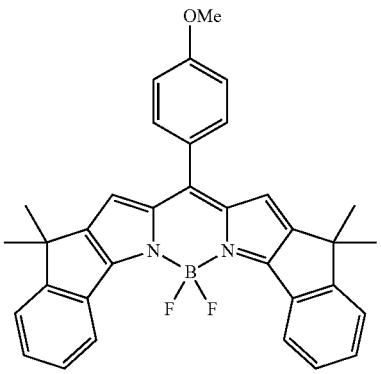

Example 1-1

A glass substrate (manufactured by GEOMATEC Co., Ltd., 11Ω/□, sputtered product) on which an ITO transparent conductive film was deposited with a thickness of 165 nm was cut into a size of 38×46 mm and etched. The obtained substrate was ultrasonically cleaned with "Semico clean 56" (trade name, manufactured by Furuuchi Chemical Corporation) for 15 minutes, and then washed with ultrapure water. Immediately before the element was produced, this substrate was subjected to a UV-ozone treatment for 1 hour, installed in a vacuum vapor deposition device, and the air was exhausted until the vacuum degree in the device became $5 \times 10^{-4}$ Pa or less. By the resistance heating method, HAT-CN6 was first vapor-deposited with the thickness of 5 nm as a hole injection layer, and HT-1 was vapor-deposited with the thickness of 50 nm as a hole transport layer. Next, as the light emitting layer, H-1 as the host material and the compound RD-A1 represented by the general formula (1) as the dopant material were, with the doping concentration of 0.5% by mass, vapor-deposited with a thickness of 20 nm. Further, as the electron transport layer, ET-1 and 2E-1, which was used as the donor material, were laminated with a thickness of 35 nm in such a way that the vapor deposition rate ratio of ET-1 and 2E-1 was 1:1. After 2E-1 was vapor-deposited with the thickness of 0.5 nm as an electron injection layer, magnesium and silver were co-deposited with the thickness of 1000 nm to form a cathode. Thus, a 5×5 mm square element was produced. The characteristics of this light emitting element at 1000 cd/m² were as follows: an emission peak wavelength of 615 nm, a full width at half maximum of 40 nm, and an external quantum efficiency of 5.2%. HAT-CN6, HT-1, H-1, ET-1, and 2E-1 were the compounds shown below.

[Chem 19]

HAT-CN6

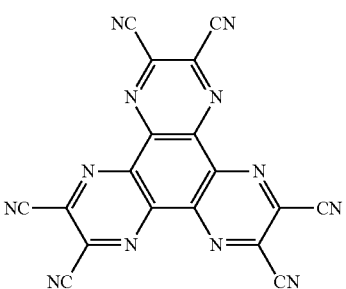

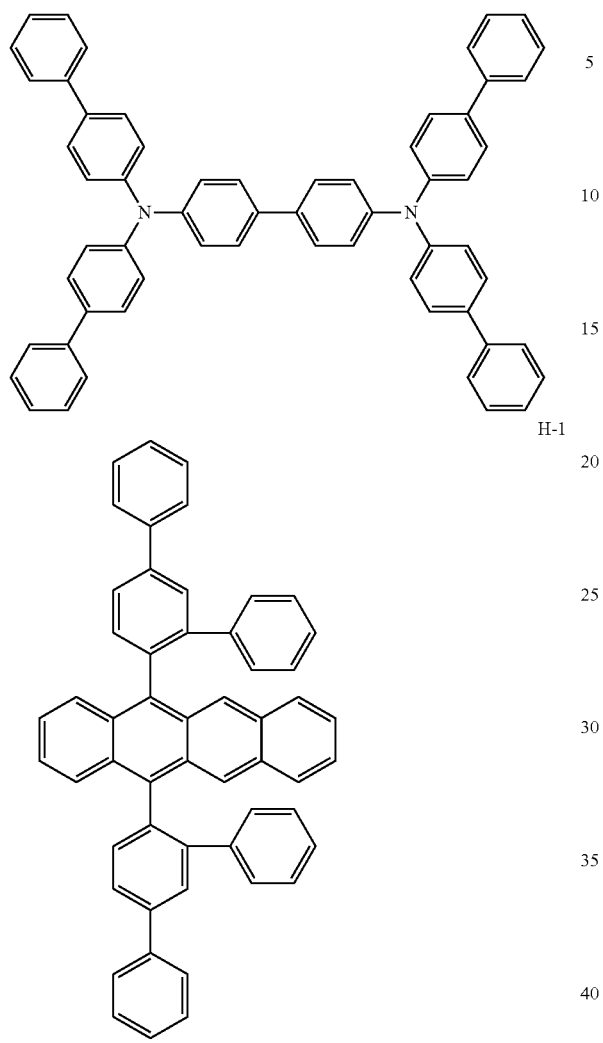

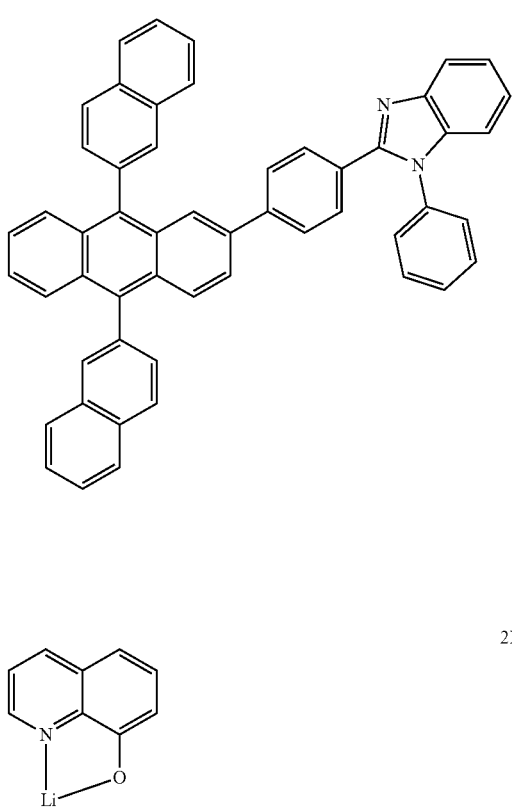

Examples 1-2 to 1-15, Comparative Examples 1-1 to 1-4

Light emitting elements were produced and evaluated in the same manner as in Example 1-1 except that the compounds shown in Table 1 were used as the dopant material. The results are shown in Table 1.

TABLE 1

|  | Dopant | Emission color | Emission peak wavelength (nm) | Full width at half maximum (nm) | External quantum efficiency (%) |
| --- | --- | --- | --- | --- | --- |
| Example 1-1 | RD-A1 | Red | 615 | 40 | 5.2 |
| Example 1-2 | RD-A2 | Red | 612 | 40 | 5.0 |
| Example 1-3 | RD-A3 | Red | 614 | 40 | 5.1 |
| Example 1-4 | RD-A4 | Red | 610 | 42 | 5.2 |
| Example 1-5 | RD-A5 | Red | 630 | 41 | 5.2 |
| Example 1-6 | RD-A6 | Red | 640 | 43 | 4.9 |
| Example 1-7 | RD-A7 | Red | 617 | 40 | 5.2 |
| Example 1-8 | RD-A8 | Red | 621 | 41 | 5.1 |
| Example 1-9 | RD-A9 | Red | 617 | 41 | 5.1 |
| Example 1-10 | RD-A10 | Red | 615 | 40 | 4.7 |
| Comparative Example 1-1 | R-A1 | Red | 615 | 47 | 4.9 |
| Comparative Example 1-2 | R-A2 | Red | 610 | 43 | 2.8 |
| Example 1-11 | RD-B1 | Red | 642 | 41 | 5.3 |
| Example 1-12 | RD-B2 | Red | 640 | 40 | 5.2 |
| Example 1-13 | RD-B3 | Red | 645 | 41 | 5.1 |
| Example 1-14 | RD-B4 | Red | 642 | 43 | 4.9 |
| Example 1-15 | RD-B5 | Red | 640 | 40 | 5.2 |

TABLE 1-continued

| | Dopant | Emission color | Emission peak wavelength (nm) | Full width at half maximum (nm) | External quantum efficiency (%) |
|---|---|---|---|---|---|
| Comparative Example 1-3 | R-B1 | Red | 643 | 43 | 2.9 |
| Comparative Example 1-4 | R-B2 | Red | 645 | 43 | 2.7 |

As can be seen from Table 1, all of Examples 1-1 to 1-15 had a narrow full width at half maximum, and highly efficient emission could be obtained. On the other hand, in Comparative Example 1, although the external quantum efficiency was high, the full width at half maximum was broad. Further, Comparative Examples 1-2 to 1-4 showed a narrow full width at half maximum, but with a low external quantum efficiency.

Example 1-16

A glass substrate (manufactured by GEOMATEC Co., Ltd., 11Ω/□, sputtered product) on which an ITO transparent conductive film was deposited with a thickness of 165 nm was cut into a size of 38×46 mm and etched. The obtained substrate was ultrasonically cleaned with "Semico clean 56" (trade name, manufactured by Furuuchi Chemical Corporation) for 15 minutes, and then washed with ultrapure water. Immediately before the element was produced, this substrate was subjected to a UV-ozone treatment for 1 hour, installed in a vacuum vapor deposition device, and the air was exhausted until the vacuum degree in the device became $5 \times 10^{-4}$ Pa or less. By the resistance heating method, HAT-CN6 was first vapor-deposited with the thickness of 10 nm as a hole injection layer, and HT-1 was vapor-deposited with the thickness of 180 nm as a hole transport layer. Next, as the light emitting layer, the host material H-2, the compound RD-A1 represented by the general formula (1), and the compound H-3 which was the TADF material were, at the mass ratio of 80:0.5:20, vapor-deposited with a thickness of 40 nm. Further, as the electron transport layer, the compound ET-1 which was used as the electron transport material and the compound 2E-1 which was used as the donor material were laminated with a thickness of 35 nm in such a way that the vapor deposition rate ratio of compounds ET-1 and 2E-1 was 1:1. After 2E-1 was vapor-deposited with the thickness of 0.5 nm as an electron injection layer, magnesium and silver were co-deposited with the thickness of 15 nm to form a cathode. Thus, a 5×5 mm square top-emission element was produced. This light emitting element exhibited emission of high color purity, with an emission peak wavelength of 625 nm and a full width at half maximum of 40 nm. When this light emitting element emitted light at brightness of 1000 cd/m², the external quantum efficiency was 18.2%. H-2 and H-3 were the compounds shown below.

[Chem 20]

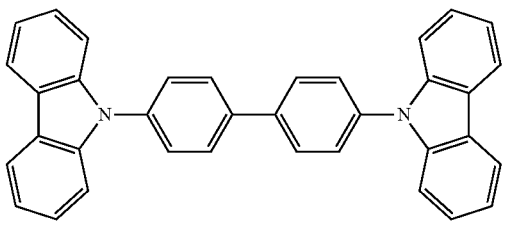

H-2

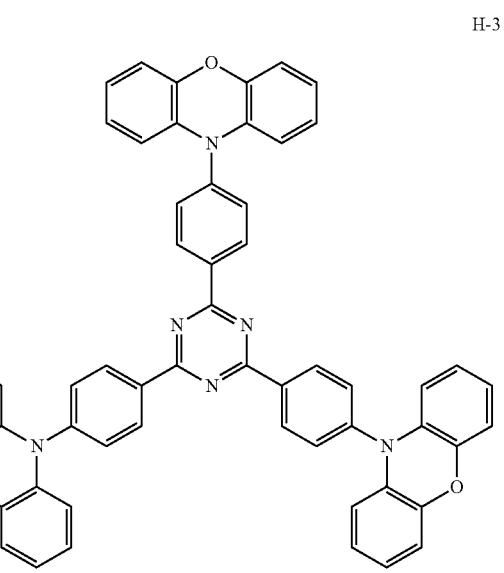

H-3

Example 1-17, Comparative Examples 1-5 to 1-7

Light emitting elements were produced and evaluated in the same manner as in Example 1-16 except that the compounds shown in Table 2 were used as the dopant material. The results are shown in Table 2.

TABLE 2

|  | Dopant | Emission color | Emission peak wavelength (nm) | Full width at half maximum (nm) | External quantum efficiency (%) |
|---|---|---|---|---|---|
| Example 1-16 | RD-A1 | Red | 625 | 40 | 18.2 |
| Comparative Example 1-5 | R-A1 | Red | 615 | 47 | 17.2 |
| Comparative Example 1-6 | R-A2 | Red | 615 | 40 | 9.4 |
| Example 1-17 | RD-B1 | Red | 641 | 41 | 17.8 |
| Comparative Example 1-7 | R-B1 | Red | 643 | 40 | 8.9 |

As can be seen from Table 2, in Examples and Comparative Examples, since the TADF material was used in the light emitting layer, the external quantum efficiency was significantly improved. Among these, Examples 1-16 and 1-17 had a narrow full width at half maximum, and highly efficient emission could be obtained. On the other hand, in Comparative Example 1-5, although the external quantum efficiency was high, the full width at half maximum was broad. Further, Comparative Examples 1-6 and 1-7 showed a narrow full width at half maximum, but with a low external quantum efficiency.

Evaluation of Color Conversion Film on Display

In a backlight unit in the following Examples and Comparative Examples, which was provided with each color conversion film, a blue LED element (emission peak wavelength: 445 nm) and a light guide plate, the color conversion film was laminated on one surface of the light guide plate and then a prism sheet was further laminated on top of the color conversion film. A current was applied to turn on the blue LED element, and the peak wavelength and the full width at half maximum were measured using a spectroradiometer (CS-1000, manufactured by Konica Minolta, Inc.). For the fluorescence quantum yield, the emission quantum yield was measured using an absolute PL quantum yield spectrometer (Quantaurus-QY, manufactured by Hamamatsu Photonics K.K.) when each color conversion film was excited at a wavelength of 450 nm.

Example 2-1

Example 2-1 of the present invention is an example in which the above-mentioned compound RD-A1 was used as a fluorescent material (color conversion material). In Example 2-1, an acrylic resin which was used as the binder resin, and with respect to 100 parts by mass of this acrylic resin, 0.05 parts by mass of the compound RD-A1 as a fluorescent material and 400 parts by mass of toluene as a solvent were mixed. Then, the mixture was stirred and defoamed at 300 rpm for 20 minutes using a planetary stirring and defoaming device "Mazerustar KK-400" (manufactured by Kurabo Industries Ltd.) to obtain a color conversion composition.

Similarly, a polyester resin which was used as the binder resin, and with respect to 100 parts by mass of this polyester resin, 300 parts by mass of toluene as a solvent were mixed. Then, this solution was stirred and defoamed at 300 rpm for 20 minutes using a planetary stirring and defoaming device "Mazerustar KK-400" (manufactured by Kurabo Industries Ltd.) to obtain an adhesive composition.

The color conversion composition obtained as described above was coated on a first substrate layer "Lumirror" U48 (manufactured by Toray Industries, Inc., thickness of 50 µm) using a slit die coater, and heated for 20 minutes at the temperature of 100° C. and then dried to obtain a layer (A) having an average film thickness of 16 µm.

Similarly, using a slit die coater, the adhesive composition obtained as described above was coated on the PET substrate layer side of a light diffusion film "Chemical Matte" 125 PW (manufactured by KIMOTO Co., Ltd., thickness of 138 µm) which was a second substrate layer. The resulting film was heated at 100° C. for 20 minutes, and dried to obtain a layer (B) having an average film thickness of 10 µm.

Next, these two layers (A) and (B) were thermally laminated in a way that the color conversion layer of the layer (A) and the adhesive layer of the layer (B) were directly laminated. Thus, a color conversion film having a laminated structure of "first substrate layer/color conversion layer/adhesive layer/second substrate layer/light diffusion layer" was produced.

When the light (blue light) from the blue LED element was subjected to color conversion using this color conversion film and only the emission region of the red light was extracted, the peak wavelength was 620 nm and the full width at half maximum of the emission spectrum at the peak wavelength was 41 nm. Thus, a red emission of high color purity was obtained. Further, with the fluorescence quantum yield in Comparative Example 2-1 described later being 1.00, the fluorescence quantum yield of the color conversion film in this Example was 1.36.

Example 2-2 and Comparative Examples 2-1 to 2-4

In Examples 2-2 and Comparative Examples 2-1 to 2-4 of the present invention, color conversion films were prepared and evaluated in the same manner as in Example 2-1 except that the compounds shown in Table 3 (compounds RD-B1, R-A1, R-A2, R-B1, R-B2) were used appropriately as fluorescent materials, and the evaluation results are shown in Table 3.

TABLE 3

|  | Fluorescent material | Emission color | Emission peak wavelength (nm) | Full width at half maximum (nm) | Fluorescence quantum yield (relative value) |
|---|---|---|---|---|---|
| Example 2-1 | RD-A1 | Red | 620 | 41 | 1.36 |
| Comparative Example 2-1 | R-A1 | Red | 619 | 50 | 1.00 |
| Comparative Example 2-2 | R-A2 | Red | 618 | 46 | 0.80 |
| Example 2-2 | RD-B1 | Red | 643 | 41 | 1.36 |
| Comparative Example 2-3 | R-B1 | Red | 644 | 45 | 1.00 |
| Comparative Example 2-4 | R-B2 | Red | 644 | 45 | 1.09 |

DESCRIPTION OF SYMBOLS 1A, 1B, 1C, 1D Color conversion films
10 Substrate layer
11 Color conversion layer
12 Barrier film

The invention claimed is:

1. A pyrromethene-boron complex represented by any of the following general formulas (3A) to (3D):

[Chem 3]

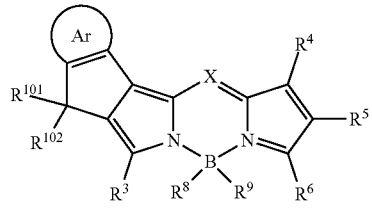

(3A)

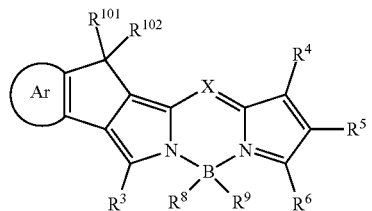

(3B)

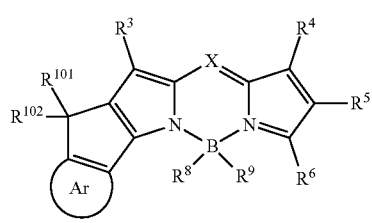

(3C)

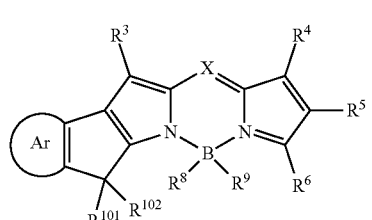

(3D)

wherein:
in the general formulas (3A) to (3D), X is C—$R^7$ or N;
in the general formulas (3A) to (3D): $R^4$ to $R^7$ each may be the same or different, and are selected from hydrogen atom, alkyl group, cycloalkyl group, heterocyclic group, alkenyl group, cycloalkenyl group, alkynyl group, hydroxyl group, thiol group, alkoxy group, alkylthio group, aryl ether group, aryl thioether group, aryl group, heteroaryl group, halogen, cyano group, aldehyde group, carboxyl group, ester group, amide group, acyl group, sulfonyl group, sulfonic acid ester group, sulfonamide group, nitro group, silyl group, siloxanyl group, boryl group, and phosphine oxide group; $R^8$ and $R^9$ each may be the same or different, and are selected from alkyl group, cycloalkyl group, heterocyclic group, alkenyl group, cycloalkenyl group, alkynyl group, hydroxyl group, thiol group, alkoxy group, alkylthio group, aryl ether group, aryl thioether group, aryl group, heteroaryl group, halogen, or cyano group;
in the general formulas of (3A) and (3B), $R^3$ may be the same or different, and are selected from hydrogen atom, alkyl group, cycloalkyl group, heterocyclic group, alkenyl group, cycloalkenyl group, alkynyl group, hydroxyl group, thiol group, alkoxy group, alkylthio group, aryl ether group, aryl thioether group, aryl group, heteroaryl group, halogen, cyano group, aldehyde group, carboxyl group, ester group, amide group, acyl group, sulfonyl group, sulfonic acid ester group, sulfonamide group, nitro group, silyl group, siloxanyl group, boryl group, and phosphine oxide group;
in the general formulas of (3C) and (3D), $R^1$ may be the same or different, and are selected from hydrogen atom, alkyl group, cycloalkyl group, heterocyclic group, alkenyl group, cycloalkenyl group, alkynyl group, hydroxyl group, thiol group, alkoxy group, alkylthio group, aryl ether group, aryl thioether group, aryl group, heteroaryl group, halogen, cyano group, aldehyde group, carboxyl group, ester group, amide group, acyl group, sulfonyl group, sulfonic acid ester group, sulfonamide group, nitro group, silyl group, siloxanyl group, boryl group, and phosphine oxide group;
$R^{101}$ and $R^{102}$ are substituted or unsubstituted alkyl groups, substituted or unsubstituted aryl groups, or substituted or unsubstituted heteroaryl groups, or $R^{101}$ and $R^{102}$ together may form a ring; and Ar is a substituted or unsubstituted benzene ring wherein:
in the general formulas of (3A) and (3B), at least one of $R^3$ to $R^6$ is a substituted or unsubstituted aryl group or a substituted or unsubstituted heteroaryl group; and
in the general formulas of (3C) and (3D), at least one of $R^1$ and $R^4$ to $R^6$ is a substituted or unsubstituted aryl group or a substituted or unsubstituted heteroaryl group;

wherein, in the general formulas of (3C) and (3D), when X is $C-R^7$, and $R^7$ is an aryl group, said aryl group is selected from substituted phenyl group or aryl group having a structure in which two or more rings are fused.

2. The pyrromethene-boron complex according to claim 1, wherein X is $C-R^7$, and $R^7$ is a substituted or unsubstituted aryl group or a substituted or unsubstituted heteroaryl group.

3. The pyrromethene-boron complex according to claim 1, wherein X is $C-R^7$, and $R^7$ is a substituted phenyl group.

4. The pyrromethene-boron complex according to claim 1, wherein X is $C-R^7$; $R^7$ is a substituted phenyl group, and said substituted phenyl group is a phenyl group having in the ortho or meta position one selected from the group consisting of phenyl group, alkyl group, alkoxy group and halogen, or a phenyl group having independently in the ortho and meta positions a group selected from the group consisting of phenyl group, alkyl group and alkoxy group, and having a ring structure formed from the selected groups.

5. The pyrromethene-boron complex according to claim 1, wherein one of $R^8$ and $R^9$ is a fluorine atom.

6. The pyrromethene-boron complex according to claim 1, wherein one of $R^8$ and $R^9$ is a cyano group.

7. The pyrromethene-boron complex according to claim 1, which emits light observed in a region having a peak wavelength of 580 nm or more and 750 nm or less when excitation light is used.

8. A light emitting element comprising an anode, a cathode, and an organic layer present between said anode and said cathode, wherein said light emitting element emits light by electric energy, and said organic layer comprises the pyrromethene-boron complex according to claim 1.

9. The light emitting element according to claim 8, wherein said light emitting element is a top-emission organic electroluminescent element.

10. The light emitting element according to claim 8, wherein said organic layer further comprises a thermally activated delayed fluorescence material.

11. A display device or a lighting device comprising the light emitting element according to claim 8.

12. A color conversion composition for converting incident light into light having a wavelength longer than that of said incident light, wherein said color conversion composition comprises the pyrromethene-boron complex according to claim 1 and a binder resin.

13. A color conversion film comprising the color conversion composition according to claim 12.

14. A color conversion substrate comprising a plurality of color conversion layers on a transparent substrate, wherein said color conversion layer is a layer made of the color conversion composition according to claim 12.

15. A light source unit comprising a light source and the color conversion film according to claim 13.

16. A display or a lighting device comprising the color conversion film according to claim 13.

17. A light source unit comprising a light source and the color conversion film according to claim 14.

18. A display or a lighting device comprising the color conversion film according to claim 14.

* * * * *

UNITED STATES PATENT AND TRADEMARK OFFICE
CERTIFICATE OF CORRECTION

PATENT NO. : 12,161,045 B2
APPLICATION NO. : 17/267936
DATED : December 3, 2024
INVENTOR(S) : Yasunori Ichihashi, Daisaku Tanaka and Tsubasa Okano It is certified that error appears in the above-identified patent and that said Letters Patent is hereby corrected as shown below:

In the Claims

In Column 73, Line 30 in Claim 1 delete the word "[Chem 3]".

In Columns 73, Line 31-66 (approx.) Claim 1:

"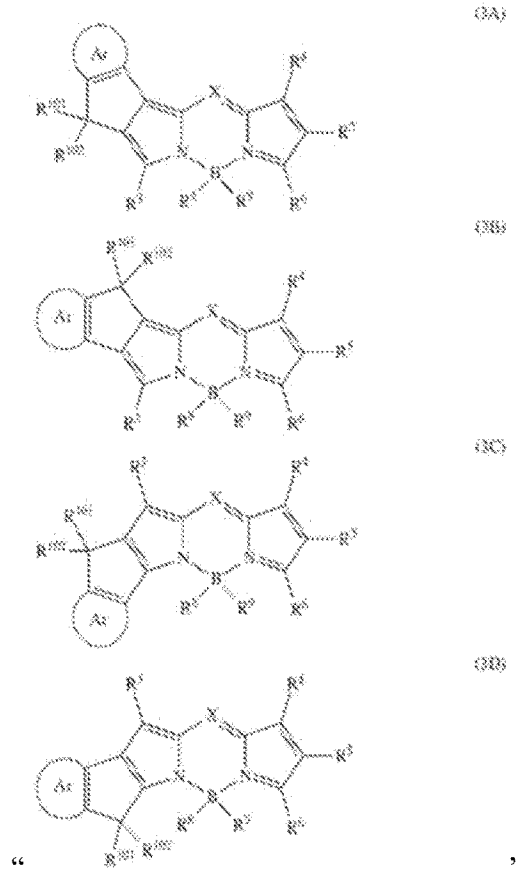"

Signed and Sealed this
Sixteenth Day of September, 2025

Coke Morgan Stewart
*Acting Director of the United States Patent and Trademark Office*

CERTIFICATE OF CORRECTION (continued)
U.S. Pat. No. 12,161,045 B2

Should be:

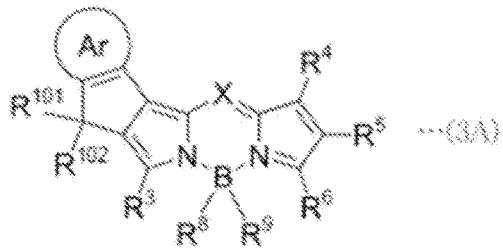 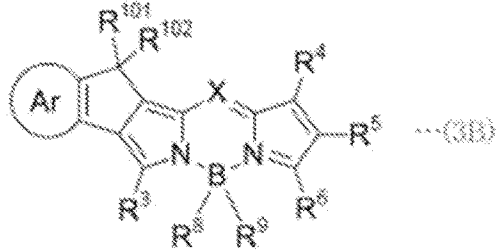

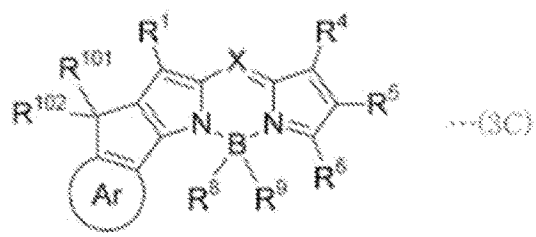 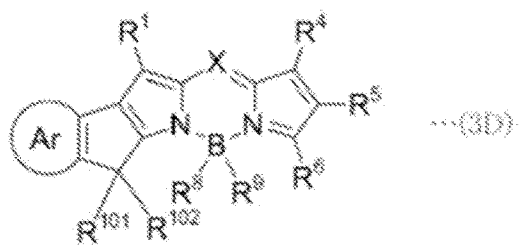

--                                                              --.

In Column 74, Line 60 in Claim 1 the word "ring" should read -- ring, --.